United States Patent
Saito et al.

(10) Patent No.: US 11,109,492 B2
(45) Date of Patent: Aug. 31, 2021

(54) STRUCTURE INCLUDING ELECTROCONDUCTIVE PATTERN REGIONS, METHOD FOR PRODUCING SAME, STACK, METHOD FOR PRODUCING SAME, AND COPPER WIRING

(71) Applicant: Asahi Kasei Kabushiki Kaisha, Tokyo (JP)

(72) Inventors: Masato Saito, Tokyo (JP); Toru Yumoto, Tokyo (JP); Masanori Tsuruta, Tokyo (JP)

(73) Assignee: Asahi Kasei Kabushiki Kaisha, Tokyo (JP)

( * ) Notice: Subject to any disclaimer, the term of this patent is extended or adjusted under 35 U.S.C. 154(b) by 64 days.

(21) Appl. No.: 16/631,715

(22) PCT Filed: Jul. 18, 2018

(86) PCT No.: PCT/JP2018/026835
§ 371 (c)(1),
(2) Date: Jan. 16, 2020

(87) PCT Pub. No.: WO2019/017363
PCT Pub. Date: Jan. 24, 2019

(65) Prior Publication Data
US 2020/0170125 A1    May 28, 2020

(30) Foreign Application Priority Data

Jul. 18, 2017 (JP) .............................. JP2017-139133
Jul. 18, 2017 (JP) .............................. JP2017-139134
(Continued)

(51) Int. Cl.
*H05K 1/09* (2006.01)
*H05K 3/10* (2006.01)
(Continued)

(52) U.S. Cl.
CPC ............. *H05K 3/4644* (2013.01); *H05K 1/09* (2013.01); *H05K 3/02* (2013.01); *H05K 3/10* (2013.01); *H05K 3/38* (2013.01)

(58) Field of Classification Search
CPC ... H05K 3/105; H05K 3/106; H05K 1/09–097
See application file for complete search history.

(56) References Cited

U.S. PATENT DOCUMENTS

| | | |
|---|---|---|
| 4,868,034 A | 9/1989 | Steinberg |
| 5,328,811 A | 7/1994 | Brestel |

(Continued)

FOREIGN PATENT DOCUMENTS

| | | |
|---|---|---|
| EP | 0316886 A2 | 5/1989 |
| EP | 2785158 A1 | 10/2014 |

(Continued)

OTHER PUBLICATIONS

International Search Report issued in corresponding International Patent Application No. PCT/JP2018/026835 dated Oct. 16, 2018.

(Continued)

*Primary Examiner* — Jeremy C Norris
(74) *Attorney, Agent, or Firm* — Morgan, Lewis & Bockius LLP

(57) ABSTRACT

Provided is a structure that has highly reliable electroconductive pattern regions, that offers an extremely simple manufacturing process, and that has excellent electrical insulation between the electroconductive pattern regions. This structure (10) having electroconductive pattern regions is provided with a support (11), and, on a surface configured by the support, a layer (14) in which insulation regions (12) containing a copper oxide- and phosphorus-containing organic substance and electroconductive pattern regions (13) containing copper are disposed next to one another. This stack is provided with: a support, a coating layer containing (Continued)

copper oxide and phosphorus and disposed on a surface configured by the support; and a resin layer disposed so as to cover the coating layer.

41 Claims, 10 Drawing Sheets

(30) Foreign Application Priority Data

| Jul. 21, 2017 | (JP) | JP2017-141518 |
|---|---|---|
| Jul. 21, 2017 | (JP) | JP2017-141519 |
| Jul. 27, 2017 | (JP) | JP2017-145188 |
| Feb. 13, 2018 | (JP) | JP2018-023239 |

(51) Int. Cl.
  *H05K 3/46* (2006.01)
  *H05K 3/02* (2006.01)
  *H05K 3/38* (2006.01)

(56) References Cited

U.S. PATENT DOCUMENTS

| 2004/0185388 A1 | 9/2004 | Hirai |
|---|---|---|
| 2004/0211979 A1 | 10/2004 | Shioiri et al. |
| 2005/0189136 A1* | 9/2005 | Kawasaki ......... H01L 23/49827 174/255 |
| 2008/0166502 A1 | 7/2008 | Nakamae |
| 2009/0181184 A1 | 7/2009 | Pope et al. |
| 2011/0155432 A1 | 6/2011 | Tomonari et al. |
| 2014/0377457 A1 | 12/2014 | Liu et al. |
| 2015/0056382 A1 | 2/2015 | Suganuma et al. |
| 2015/0245479 A1 | 8/2015 | Usami et al. |
| 2016/0007455 A1 | 1/2016 | Kawato et al. |
| 2016/0024316 A1 | 1/2016 | Sasada et al. |
| 2016/0024317 A1 | 1/2016 | Hayata et al. |
| 2016/0086688 A1 | 3/2016 | Hongo et al. |
| 2016/0155814 A1 | 6/2016 | Ogawa et al. |
| 2017/0118836 A1 | 4/2017 | Kim et al. |
| 2017/0140847 A1 | 5/2017 | Kamikoriyama et al. |
| 2017/0252801 A1 | 9/2017 | Ida et al. |

FOREIGN PATENT DOCUMENTS

| EP | 3127969 A1 | 2/2017 |
|---|---|---|
| JP | S63-081997 A | 4/1988 |
| JP | H01-129492 A | 5/1989 |
| JP | H01-220303 A | 9/1989 |
| JP | H05-037126 A | 2/1993 |
| JP | H05-041575 A | 2/1993 |
| JP | H05-279862 A | 10/1993 |
| JP | H07-014427 A | 1/1995 |
| JP | 2004-119686 A | 4/2004 |
| JP | 2004-253794 A | 9/2004 |
| JP | 2004-327703 A | 11/2004 |
| JP | 2006-216572 A | 8/2006 |
| JP | 2007-080720 A | 3/2007 |
| JP | 2008-193067 A | 8/2008 |
| JP | 2009-283547 A | 12/2009 |
| JP | 2010-146995 A | 7/2010 |
| JP | 2012-142318 A | 7/2012 |
| JP | 2013-115004 A | 6/2013 |
| JP | 2014-041969 A | 3/2014 |
| JP | 5449154 B2 | 3/2014 |
| JP | 2014-225338 A | 12/2014 |
| JP | 2015-008136 A | 1/2015 |
| JP | 2015-018675 A | 1/2015 |
| JP | 2015-026681 A | 2/2015 |
| JP | 2015-210973 A | 11/2015 |
| JP | 2016-014181 A | 1/2016 |
| JP | 2016-058227 A | 4/2016 |
| JP | 2016-527665 A | 9/2016 |
| JP | 2016-176146 A | 10/2016 |
| JP | 2016-225513 A | 12/2016 |
| TW | I499647 B | 9/2015 |
| WO | 2009/014391 A2 | 1/2009 |
| WO | 2010/024385 A1 | 3/2010 |
| WO | 2014/098158 A1 | 6/2014 |
| WO | 2014/119498 A1 | 8/2014 |
| WO | 2015/012264 A1 | 1/2015 |
| WO | 2015/050589 A2 | 4/2015 |
| WO | 2016/031860 A1 | 3/2016 |

OTHER PUBLICATIONS

International Preliminary Report on Patentability and Written Opinion issued in corresponding International Patent Application No. PCT/JP2018/026835 dated Jan. 21, 2020.
Supplementary European Search Report issued in related European Patent Application No. 18767041.9 dated Dec. 16, 2020.

* cited by examiner

STRUCTURE INCLUDING ELECTROCONDUCTIVE PATTERN REGIONS, METHOD FOR PRODUCING SAME, STACK, METHOD FOR PRODUCING SAME, AND COPPER WIRING

FIELD

The present invention relates to a structure comprising a conductive pattern region and a method for the production thereof, a stack and a method for the production thereof, and copper wiring.

BACKGROUND

Circuit boards have structures in which conductive wiring is applied to a substrate. The conventional method for the production of a circuit board is as follows. First, a photoresist is applied to a substrate on which a metal foil is bonded. Next, the photoresist is exposed and developed to obtain a negative shape of the desired circuit pattern. Thereafter, the portion of the metal foil not covered with the photoresist is removed by chemical etching to form the pattern. As a result, a high-performance conductive substrate can be produced.

However, the conventional method has disadvantages in that it has a large number of steps, is complicated, and necessitates the use of a photoresist material.

In connection thereto, a direct wiring printing technology in which a desired wiring pattern is directly printed onto a substrate as a dispersion in which fine particles selected from the group consisting of metal fine particles and metal oxide fine particles are dispersed (hereinafter also referred to as "paste material") has been proposed. This technology has a small number of steps and does not necessitate the use of a photoresist material, whereby the productivity thereof is high.

As an example of the direct wiring printing technology, printing a paste material onto a support by means of screen printing or ink jet printing, and thereafter thermally baking the paste material to obtain a low resistance wiring pattern is known (refer to, for example, Patent Literature 1).

Furthermore, a method in which a desired wiring pattern is obtained by applying a paste material onto all of the surfaces of a substrate, and irradiating the paste material with laser light to selectively heat-sinter the paste material is known (refer to, for example, Patent Literature 1 and 2).

A method in which copper wiring is produced by applying a dispersion including cuprous oxide aggregate particles at a thickness of 10 to 20 μm onto a polyethylene terephthalate (PET) support, and thereafter sintering with a laser is known (refer to, for example, Patent Literature 3). According to this method, since portions which are not irradiated with the laser are not heated, a low heat-resistance resin material such as a PET support can be used.

The use of colloidal silica, which consists of silicon oxide particles, as an underlayer in order to improve adhesion between a support and a metallic copper-containing film obtained by sintering a copper paste is known (refer to, for example, Patent Literature 4).

A method for the production of a multilayer circuit board by forming a first coating layer on a substrate, irradiating a part of the first coating layer with light to form a first conductive part, thereafter forming a second coating layer on the first coating layer, and irradiating the first conductive part with light from the second coating layer to form a second conductive part is known (refer to, for example, Patent Literature 5).

A method in which a conductive film is obtained by forming a patterned coating film on a substrate using a copper or copper oxide dispersion, and thereafter performing heat-treatment is known (refer to, for example, Patent Literature 6).

CITATION LIST

Patent Literature

[PTL 1] WO 2010/024385
[PTL 2] Japanese Unexamined Patent Publication (Kokai) No. 5-37126
[PTL 3] Japanese Patent No. 5449154
[PTL 4] WO 2016/031860
[PTL 5] Japanese Unexamined Patent Publication (Kokai) No. 2015-26681
[PTL 6] WO 2015/012264

SUMMARY

Technical Problem

In the direct wiring printing technology described in Patent Literature 1 to 3, in which a wiring pattern is formed by the laser irradiation of a paste material, in regions which are not subjected to laser irradiation, unsintered paste material remains. The unsintered paste material is conductive, and if left as-is, electrical insulation within the wiring pattern cannot be ensured. Thus, it is necessary to remove the unsintered paste material and fill gaps of the wiring pattern with an insulating material such as solder resist.

Thus, in the conventional direct wiring printing technology, steps for removing the unsintered paste material and for applying the insulating material are necessary, whereby the merit regarding the reduced number of steps is reduced. Furthermore, a solvent or rinsing agent for removing the unsintered paste material is necessary, which leads to an increase in production costs.

In the case in which the conventional direct wiring printing technology is used to form a wiring pattern on a flexible substrate, when the obtained circuit board is subjected to heat-cycle testing in low-temperature environments and high-temperature environments, there is a problem in that cracks form between the solder resist and the wiring.

The colloidal silica used in the underlayer disclosed in Patent Literature 4 adheres well to metal, but adheres poorly to resins. Thus, when the material of the substrate is a resin, peeling occurs between the underlayer and the substrate, whereby reliability is low.

In the method described in Patent Literature 5, unsintered paste material composed of cupric oxide particles and a resin binder remains in regions which were not subjected to laser irradiation. Since the cupric oxide particles are large, and the resin binder and particles are localized, in such a state, the electrical insulation within the wiring pattern is insufficient.

Since in the structure described in Patent Literature 6, the wiring pattern is not filled, in such a state, electrical insulation within the wiring pattern cannot be ensured. Furthermore, in environments with high humidity, air containing moisture enters within the wiring pattern, which can easily cause dielectric breakdown.

In light of such points, the present invention aims to provide a structure including a conductive pattern region and a production method therefor having a significantly simplified manufacturing process, in which the electrical insulation within the conductive pattern region is excellent, and which has excellent long-term reliability.

Furthermore, in light of such points, the present invention aims to provide a stack and a method for the production thereof with which equipment for generating a vacuum atmosphere or inert gas atmosphere is not necessary in a copper oxide light sintering treatment, and with which the production costs of a structure including a conductive pattern region can be reduced.

Further, the present invention aims to provide copper wiring in which the conductivity of the wiring can be improved.

Solution to Problem

As a result of rigorous investigation in order to achieve the above objects, the present inventors have completed the present invention.

In other words, an aspect of the structure according to the present invention comprises a support and a layer arranged on a surface constituted by the support, wherein a conductive pattern region including copper and an insulation region including copper oxide and phosphorus are adjacent to each other in the layer.

Another aspect of the structure according to the present invention comprises a support and a layer arranged on a surface constituted by the support, wherein a conductive pattern region including copper and an insulation region including copper oxide, and hydrazine or hydrazine hydrate are adjacent to each other in the layer.

Another aspect of the structure according to the present invention comprises a support and a layer arranged on a surface constituted by the support, wherein a conductive pattern region including copper and an insulation region including copper oxide, phosphorus, and hydrazine or hydrazine hydrate are adjacent to each other in the layer.

Another aspect of the structure according to the present invention comprises a support and a layer arranged on a surface constituted by the support, wherein a conductive pattern region including copper and phosphorus and an insulation region including copper oxide and phosphorus are adjacent to each other in the layer.

An aspect of the stack according to the present invention comprises a support, a coating layer, which is arranged on a surface constituted by the support and which includes copper oxide and phosphorus, and a resin layer arranged so as to cover the coating layer.

An aspect of the stack according to the present invention comprises a support, a coating layer, which is arranged on a surface constituted by the support and which includes copper oxide, and hydrazine or hydrazine hydrate, and a resin layer arranged so as to cover the coating layer.

An aspect of the stack according to the present invention comprises a support, a coating layer, which is arranged on a surface constituted by the support and which includes copper oxide, phosphorus, and hydrazine or hydrazine hydrate, and a resin layer arranged so as to cover the coating layer.

An aspect of the copper wiring according to the present invention comprises reduced copper, which is obtained by reducing copper oxide, phosphorus, and carbon, wherein the elemental concentration ratio of phosphorus to copper is 0.02 to 0.30, and the elemental concentration ratio of carbon to copper is 1.0 to 6.0.

An aspect of the method for production of the structure according to the present invention comprises the steps of arranging a coating layer comprising copper oxide and phosphorus-containing organic matter on a surface constituted by a support, and selectively irradiating the coating layer with light to reduce the copper oxide to copper, to obtain the support and a layer in which an insulation region including the copper oxide and phosphorus and a conductive pattern region including the copper are arranged adjacent to each other on the surface constituted by the support.

An aspect of the method for production of the structure according to the present invention comprises the steps of arranging a coating layer comprising copper oxide, and hydrazine or hydrazine hydrate on a surface constituted by a support, and selectively irradiating the coating layer with light to reduce the copper oxide to copper, to obtain the support and a layer in which an insulation region including the copper oxide and the hydrazine or hydrazine hydrate and a conductive pattern region including the copper are arranged adjacent to each other on the surface constituted by the support.

An aspect of the method for production of the structure according to the present invention comprises the steps of arranging a coating layer comprising copper oxide, phosphorus-containing organic matter, and hydrazine or hydrazine hydrate on a surface constituted by a support, and selectively irradiating the coating layer with light to reduce the copper oxide to copper, to obtain the support and a layer in which an insulation region including the copper oxide, the phosphorus-containing organic matter, and the hydrazine or hydrazine hydrate and a conductive pattern region including the copper are arranged adjacent to each other on the surface constituted by the support.

An aspect of the method for production of the stack according to the present invention comprises the steps of arranging a coating layer including copper oxide and phosphorus-containing organic matter on a surface constituted by a support, and arranging a resin layer so as to cover the coating layer.

An aspect of the method for production of the stack according to the present invention comprises the steps of arranging a coating layer including copper oxide, and hydrazine or hydrazine hydrate on a surface constituted by a support, and arranging a resin layer so as to cover the coating layer.

An aspect of the method for production of the stack according to the present invention comprises the steps of arranging a coating layer including copper oxide, phosphorus-containing organic matter, and hydrazine or hydrazine hydrate on a surface constituted by a support, and arranging a resin layer so as to cover the coating layer.

Advantageous Effects of Invention

According to the present invention, a structure including a conductive pattern region and a production method therefor having a significantly simplified manufacturing process, in which the electrical insulation within the conductive pattern region is excellent, and which has excellent long-term reliability can be provided.

Furthermore, according to the present invention, a stack and a method for the production thereof with which equipment for generating a vacuum atmosphere or inert gas atmosphere is not necessary in a copper oxide light sintering treatment, and with which the production costs of a structure including a conductive pattern region can be reduced can be provided.

Furthermore, according to the present invention, copper wiring in which the conductivity of the wiring is improved can be provided.

DESCRIPTION OF EMBODIMENTS

The modes for carrying out the present invention (hereinafter referred to as "embodiments") will be described in detail below.

Overview of Structure Comprising Conductive Pattern Region (Structure with Conductive Pattern Region) According to the Present Embodiment The present inventors have discovered that when a conductive pattern region is formed by arranging a coating layer including copper oxide on a surface of a support, selectively irradiating the coating layer to reduce the copper oxide to copper, as long as the electrical insulation of the region including unreduced copper oxide is high, by leaving the region as-is without removal, insulation between the conductive pattern regions can be ensured, and a process for removing the region is not necessary, and have completed the present invention.

In other words, in the structure comprising a conductive pattern region according to the present embodiment, phosphorous is contained in the coating layer including copper oxide arranged on the surface of the support. Thereafter, by selectively irradiating the coating layer, a conductive pattern region is formed, and additionally an insulation region including copper oxide and phosphorus is provided within the conductive pattern region.

Figure 1:
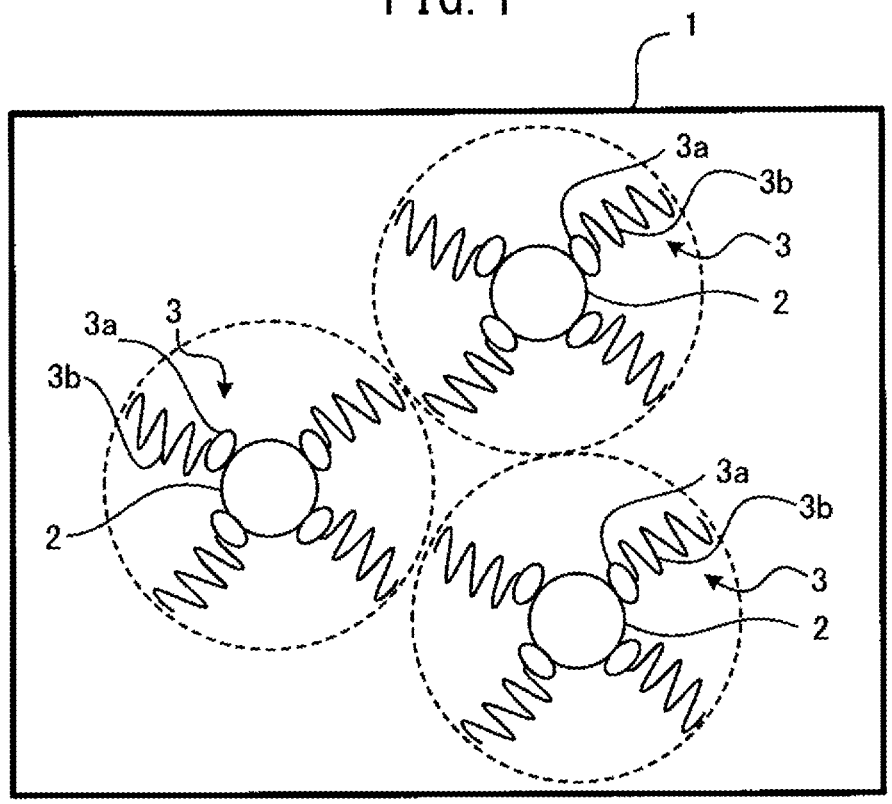
FIG. 1 is a schematic view showing the relationship between cuprous oxide fine particles and phosphate ester salt contained in an insulation region of the structure comprising a conductive pattern region according to the present embodiment.

FIG. 1 is a schematic view showing the relationship between copper oxide fine particles and phosphate ester salt contained in the insulation region of the structure comprising a conductive pattern region according to the present embodiment. As shown in FIG. 1, in the insulation region 1, a phosphate ester salt 3, which is an example of phosphorus-containing organic matter, is interposed by phosphorus 3a from the inside and an ester salt 3b from the outside around the copper oxide fine particles 2, which are an example of a copper oxide. Since the phosphate ester salt 3 exhibits electrical insulation, electrical conduction between adjacent copper oxide fine particles 2 is interrupted.

Thus, though the copper oxide fine particles 2 are semiconductors and are conductive, they are covered with the phosphate ester salt 3, which exhibits electrical insulation. Therefore, the insulation region 1 exhibits electrical insulation, and in a cross-sectional view (the cross-section along the upward and downward directions shown in FIG. 2), insulation between adjacent conductive pattern regions on both sides of the insulation region 1 can be ensured.

In the conductive pattern region, by irradiating a part of the region of the coating layer including copper oxide and phosphorus, copper oxide can be reduced to copper in the part of the region. Such copper obtained by reducing copper oxide is referred to as reduced copper. Furthermore, in the part of the region, the phosphorus-containing organic matter generates phosphorus oxide. In phosphorus oxide, organic matter such as the aforementioned ester salt 3b (refer to FIG. 1) is decomposed by heating with a laser or the like, whereby electrical insulation is not exhibited.

Furthermore, as shown in FIG. 1, when the copper oxide fine particles 2 are used, the copper oxide is changed to reduced copper and sintered by heating with a laser or the like, whereby adjacent copper oxide fine particles 2 become integral with each other. As a result, a region having excellent electrical conductivity (hereinafter referred to as a "conductive pattern region") can be formed.

Elemental phosphorus remains within the reduced copper in the conductive pattern region. The elemental phosphorus is present as at least one of elemental phosphorus alone, phosphorus oxide, and phosphorus-containing organic matter. The elemental phosphorus remaining in this manner is present within and separates the conductive pattern regions, whereby the risk of an increase in the resistance of the conductive pattern region is eliminated.

Figure 2:
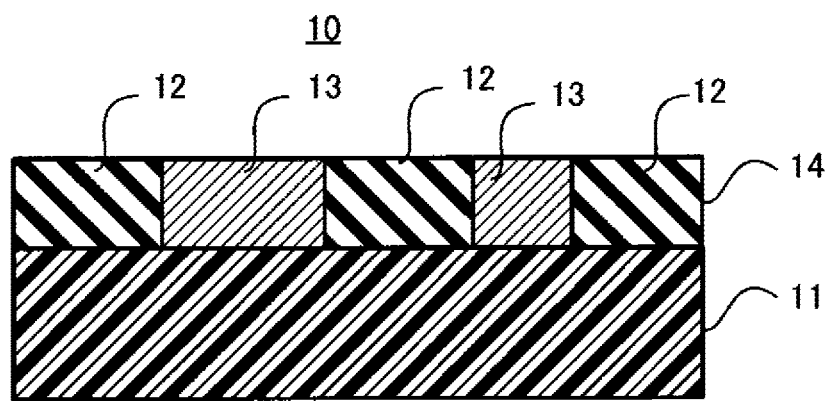
FIG. 2 is a cross-sectional schematic view showing a structure comprising a conductive pattern region according to a first embodiment.

Configuration of Structure Comprising a Conductive Pattern Region: First Embodiment FIG. 2 is a cross-sectional schematic view showing the structure comprising a conductive pattern region according to the first embodiment. As shown in FIG. 2, the structure 10 comprises and is composed of a support 11, and a layer 14 which is arranged on a surface constituted by the support 11. In the layer 14, an insulation region 12 including copper oxide and phosphorus and a conductive pattern region 13 including copper are adjacent to each other. The copper used herein is preferably the reduced copper described above.

Furthermore, it is preferable that the phosphorus included in the insulation region 12 be included as phosphorus-containing organic matter.

As a result of this structure, the conductive pattern regions including copper can be insulated by the insulation regions including copper oxide and phosphorus, and thus, it is not necessary to remove unsintered portions of the layer 14 during production. Thus, the production steps can be simplified, and since a solvent or the like is not necessary, production costs can be reduced. Furthermore, by adopting an insulation region for insulation the conductive pattern region, the insulation region can hinder the occurrence of cracking, whereby reliability can be increased.

The components of the structure comprising a conductive pattern region according to the first embodiment will be described below.

<Support>

The support 11 constitutes a surface on which the layer 14 is arranged. The shape thereof is not particularly limited.

The material of the support 11 is preferably an insulating material in order to ensure electrical insulation between conductive pattern regions 13 separated by the insulation region 12. However, it is not necessary that the entirety of the support 11 be an insulating material. It is sufficient that only the portion constituting the surface on which the layer 14 is arranged be an insulating material.

More specifically, the support 11 may be a flat plate-like body, film, or sheet. The flat plate-like body is preferably a support (hereinafter also referred to as a substrate) used in, for example, circuit boards such as printed circuit boards. The film or sheet is preferably a base film, which is a thin film-like insulating body used in, for example, flexible printed circuit boards.

The support 11 may be a three-dimensional object. The layer comprising a conductive pattern region can be arranged on a curved surface or surface including steps or the like, i.e., a steric surface, of the three-dimensional object.

Examples of the three-dimensional object include the housings of electrical devices such as mobile phone terminals, smart phones, smart glasses, televisions, and personal computers. Furthermore, additional examples of the three-dimensional object include, in the field of automobiles, dashboards, instrument panels, handles, and chassis.

Furthermore, though the material of the three-dimensional object is not limited, it is preferably at least one selected from the group consisting of polypropylene resin, polyamide resin, acrylonitrile butadiene styrene resin, polyethylene resin, polycarbonate resin, polyacetal resin, polybutylene terephthalate resin, modified polyphenylene ether resin, and polyphenylene sulfide resin.

<Layer Arranged on Surface of Support (Layer Comprising Conductive Pattern Region)>

In the present embodiment, the layer 14 can be referred to a layer in which the insulation region 12 and the conductive pattern region 13 coexist. Hereinafter, the layer having a conductive pattern region or the layer arranged on the support may be simply referred to as the "layer".

The layer 14 is referred to as an integrated layer. Furthermore, the layer 14 is referred to as a single layer lacking a multilayer structure. "Integrated" and "single" mean that adjacent insulation regions 12 and conductive pattern regions 13 are continuous in a cross-sectional view along the surface. "Adjacent" means that another layer is not present between the insulation region 12 and the conductive pattern region 13. "Continuous" means, for example, that a state in which the patterned wiring layer is filled with solder paste, as seen on a printed circuit board, is not included.

In the present embodiment, steps may occur between the surface of the insulation region 12 and the surface of the conductive pattern region 13. Specifically, since the film thickness is reduced in the process of reducing copper oxide to copper, even if the layer is continuous, the film thickness of the conductive region and the insulation region may be different.

The insulation region 12 and the conductive pattern region 13 being adjacent means that within the layer, the electrical conductivity and particle state (sintered and unsintered) may gradually change along the surface of the support, and a boundary (interface) between the insulation region 12 and the conductive pattern region 13 may be present.

Furthermore, the insulation region 12 and the conductive pattern region 13 are formed from a coating layer derived from the same composition. In other words, the conductive pattern region 13 is formed by subjecting a part of the coating layer to laser irradiation, and thus, the same element such as elemental copper or elemental phosphorus is included in the insulation region 12 and the conductive pattern region 13.

<Insulation Region>

The insulation region 12 includes copper oxide and phosphorus, and exhibits electrical insulation. The insulation region may also be referred to as an unirradiated region which has not been subjected to irradiation. Furthermore, the insulation region 12 may also be referred to as a non-reduced region in which the copper oxide has not been reduced by irradiation. The insulation region 12 may also be referred to as an unsintered region which has not been sintered by irradiation.

<Conductive Pattern Region>

The conductive pattern region includes copper and exhibits electrical conductivity. The conductive pattern region can also be referred to as an irradiated region or a laser irradiated region which has been subjected to irradiation. Furthermore, the conductive pattern region can also be referred to as a reduced region including reduced copper obtained by reducing copper oxide by irradiation. The conductive pattern region 13 can also be referred to as a sintered region containing a sintered body obtained by sintering the insulation region 12 by irradiation.

The shape, i.e., the pattern, of the conductive pattern region 13 in a plan view may be any of linear, curved, circular, square, and bent, and is not particularly limited. Since the pattern is formed by irradiation via a mask or drawn with a laser, the shape thereof is not particularly limited.

Though the boundary between the insulation region 12 and the conductive pattern region 13 is preferably a straight line along the thickness direction of the layer 14 (the upward and downward directions shown in FIG. 2), a taper angle may be imparted thereto, though the boundary is not particularly limited. However, it is not necessary that the boundary be clear. For example, when the copper composition ratio is measured near the boundary, there may be a compositional irregularity region which gradually changes from the conductive pattern region 13 side to the insulation region 12 side.

It is not necessary that the conductive pattern region 13 be entirely reduced in a cross-sectional view. For example, it is preferable that the portion near the support 11 be an unreduced portion. As a result, the adhesion between the conductive pattern region 13 and the support 11 becomes high.

As shown in FIG. 2, in the present embodiment, the film thickness of the conductive pattern region 13 and the film thickness of the insulation region 12 may be different so that, for example, the film thickness of the insulation region 12 is greater. In other words, in the reduction process in which copper oxide is reduced to copper by laser irradiation, the film thickness of the conductive pattern 13 tends to be less than that of the insulation region 12. By making the film thicknesses different, since the creepage distance between a conductive pattern region 13 and a conductive pattern region 13, which face each other with the insulation region 12 interposed therebetween, can be increased, the insulation property can be increased. The film thickness of the insulation region 12 is preferably in the range of 0.1 µm to 30 µm, more preferably 0.1 µm to 15 µm, and further preferably 0.1 µm to 10 µm. In particular, a film thickness within the range of 1 µm to 10 µm is preferable since the insulation property as the insulation region 12 can be maintained and conductive pattern regions 13 having improved substrate adhesion and conductivity can be produced by light irradiation, which will be described later. The film thickness of the conductive pattern region 13, relative to the film thickness of the insulation region 12, is preferably in the range of 10% to 90%, more preferably 20% to 80%, and further preferably 30% to 70%. In particular, a film thickness of 30% to 70% that of the insulation region 12 is preferable since substrate adhesion can be maintained and sufficient electrical conductivity for electrical wiring applications can be obtained.

<Adhesion Layer>

It is preferable that the support 11 comprise an adhesion layer (not illustrated) between the layers 14 comprising a conductive pattern region. Due to the adhesion layer, the adhesive properties of the layers 14 with the support 11 can be improved, peeling of the insulation regions 12 and the conductive pattern regions 13 can be prevented, and the long-term stability of the structure 10 can be increased.

The adhesion layer 11 encompasses, for example, (i) roughening of the surface constituted by the support 11, and (ii) the arranging of a coating layer on the layer constituted by the support 11. In the example of (i), the adhesion layer is a part of the support 11. In this case, the adhesion layer may be combined with another layer (for example, a primer (under) layer).

In the example of (ii), the adhesion layer may be the adhesion layer may be a coating layer alone or a stack of other layers. Furthermore, the coating layer may include a primer material.

<Details of Structure Including Conductive Pattern Region>

Each structure of the structure 10 according to the present embodiment will be more specifically described below. However, the structures are not limited to the specific examples described below.

(Support)

Specific examples of the support include supports composed of an inorganic material (hereinafter referred to as an "inorganic support") and supports composed of a resin (hereinafter referred to as a "resin support").

The inorganic support is composed of, for example, glass, silicon, mica, sapphire, quartz, a clay film, or ceramic material. The ceramic material is, for example, alumina, silicon nitride, silicon carbide, zirconia, yttria, aluminum nitride, or mixtures of at least two of these. Furthermore, a support composed of glass, sapphire, quartz, or the like, which has a particularly high light transmittance, can be used as the inorganic support.

A support composed of, for example, polypropylene (PP), polyimide (PI), polyethylene terephthalate (PET), polyethersulfone (PES), polyethylene naphthalate (PEN), polyester, polycarbonate (PC), polyvinyl alcohol (PVA), polyvinyl butyral (PVB), polyacetal (POM), polyarylate (PAR), polyamide (PA), polyamideimide (PAI), polyetherimide (PEI), polyphenylene ether (PPE), modified polyphenylene ether (m-PPE), polyphenylene sulfide (PPS), polyether ketone (PEK), polyphthalamide (PPA), polyether nitrile (PENt), polybenzimidazole (PBI), polycarbodiimide, polysiloxane, polymethacrylamide, nitrile rubber, acrylic rubber, polyethylene tetrafluoride, epoxy resin, phenol resin, melamine resin, urea resin, polymethyl methacrylate resin (PMMA), polybutene, polypentene, an ethylene-propylene copolymer, an ethylene-butene-diene copolymer, polybutadiene, polyisoprene, an ethylene-propylene-diene copolymers, butyl rubber, polymethylpentene (PMP), polystyrene (PS), a styrene-butadiene copolymer, polyethylene (PE), polyvinyl chloride (PVC), polyvinylidene fluoride (PVDF), polyether ether ketone (PEEK), phenol novolac, benzocyclobutene, polyvinyl phenol, polychloropyrene, polyoxymethylene, polysulfone (PSF), polyphenylsulfone resin (PPSU), cycloolefin polymer (COP), acrylonitrile-butadiene-styrene resin (ABS), acrylonitrile-styrene resin (AS), nylon resin (PA6, PA66), polybutyl terephthalate resin (PBT), polyethersulfone resin (PESU), polytetrafluoroethylene resin (PTFE), polychlorotrifluoroethylene (PCTFE), or silicone resin can be used as the resin support.

Though not classified as the above, a resin sheet containing cellulose nanofibers can also be used as the support.

In particular, at least one selected from the group consisting of PI, PET and PEN is excellent in adhesion between the layer including a conductive pattern region and the adhesion layer, superior in market distribution, available at low cost, significant from the viewpoint of business, and preferable.

Further, at least one selected from the group consisting of PP, PA, ABS, PE, PC, POM, PBT, m-PPE, and PPS, in particular in the case of a housing, is excellent in adhesion between the layer including a conductive pattern region and the adhesion layer, and is excellent in formability and mechanical strength after molding. Further, these are preferable since they have heat resistance sufficient to withstand laser irradiation when forming the conductive pattern region.

The deflection temperature under load of the resin support is preferably 400° C. or less, more preferably 280° C. or less, and further preferably 250° C. or less. A support having a deflection temperature under load of 400° C. or less is available at low cost, significant from the viewpoint of business, and preferable. The deflection temperature under load is measured in accordance with JIS K7191.

The thickness of the support can be, for example, 1 µm to 100 mm, preferably 25 µm to 10 mm, and more preferably 25 µm to 250 µm. A support thickness of 250 µm or less is preferable since the electronic devices produced therewith can be made lighter, whereby space-savings and flexibility can be achieved.

It should be noted that when the support is a housing, the thickness thereof can be, for example, 1 µm to 1000 mm, preferably 200 µm to 100 mm, more preferably 200 µm to 5 mm. The present inventors have clarified that by selecting from within this range, the mechanical strength and heat resistance after molding can be exhibited.

The light transmittance at a wavelength of 445 nm of the support or, when the support comprises the adhesion layer, the support including the adhesion layer is preferably 30% or more, more preferably 40% or more, and further preferably 50% or more. The upper limit of the light transmittance may be 98% or less. In addition to a wavelength of 445 nm, the wavelength can be selected from near ultraviolet to near infrared such as 355 nm, 405 nm, 450 nm, 532 nm, or 1064 nm. By improving light transmittance at such a wavelength, the layer having a conductive pattern region can be formed by irradiating light from the support side to sinter the coating layer.

(Layer Arranged on Surface of Support (Layer Including Conductive Pattern Region))

In the layer, the insulation region including copper oxide and phosphorus-containing organic matter and the conductive pattern region including copper are adjacent.

(Copper Oxide)

In the present embodiment, copper oxide encompasses, for example, cuprous oxide and cupric oxide. Cuprous oxide is particularly preferable since it can be easily low-temperature sintered. Cuprous oxide and cupric oxide may be used individually or may be used as a mixture thereof.

Furthermore, the copper oxide fine particles have a core/shell structure, and the cuprous oxide may be used as either the core or the shell, and cupric oxide may be included as the other.

The copper oxide included in the insulation region is in the form of, for example, fine particles. The average particle diameter of the fine particles of copper oxide is 1 nm to 100 nm, more preferably 1 nm to 50 nm, and further preferably 1 nm to 20 nm. As the particle diameter decreases, the electrical insulation of the insulation improves, which is preferable.

Copper particles may be included in the insulation region. In other words, copper may be added to the dispersion described later. The phosphorus-containing organic matter may be adsorbed on the surface of the copper particles, whereby electrical insulation is exhibited.

(Phosphorus-Containing Organic Matter)

The phosphorus included in the insulation region is preferably phosphorus-containing organic matter. The phosphorus-containing organic matter is a material which exhibits electrical insulation in the insulation region. It is preferable that the phosphorus-containing organic matter be capable of securing the copper oxide in the support or adhesion layer. The phosphorus-containing organic matter may be a single type of molecule or a mixture of a plurality of types of molecules. Furthermore, the phosphorus-containing organic matter may be adsorbed on the copper oxide fine particles.

The number-average molecular weight of the phosphorus-containing organic matter is not particularly limited, and is preferably 300 to 300,000. As long as the number average molecular weight is 300 or more, electrical insulation is excellent.

It is preferable that the phosphorus-containing organic matter be easily decomposed or evaporated by light or heat. By using organic matter which is easily decomposed or evaporated by light or heat, residual organic matter is less likely to remain after sintering, whereby a conductive pattern region having a low resistance ratio can be obtained.

The decomposition temperature of the phosphorus-containing organic matter is not particularly limited and is preferably 600° C. or less, more preferably 400° C. or less, and further preferably 200° C. or less. The boiling point of the phosphorus-containing organic matter is not particularly limited and is preferably 300° C. or less, more preferably 200° C. or less, and further preferably 150° C. or less.

The absorption characteristics of the phosphorus-containing organic matter are not limited, and it is preferable that the phosphorus-containing organic matter be capable of absorbing the light used for sintering. For example, when laser light is used as the light source for sintering, it is preferable that phosphorus-containing organic matter which absorbs the light thereof having an emission wavelength (center wavelength) of, for example, 355 nm, 405 nm, 445 nm, 450 nm, 532 nm, or 1064 nm be used. When the support is composed of a resin, a wavelength of 355 nm, 405 nm, 445 nm, or 450 nm is particularly preferable.

Furthermore, the structure thereof may be a phosphate ester salt of a high molecular weight copolymer having a group having an affinity for copper oxide. For example, the structure of chemical formula (1) is preferable since it can adsorb copper oxide and has excellent adhesion with the support.

[Chem. 1]

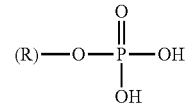

Chemical Formula (1)

in chemical formula (1), R is an ester salt.

The structure of chemical formula (2) is an example of the ester salt.

[Chem. 2]

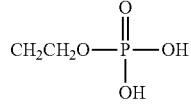

Chemical Formula (2)

Furthermore, the structure of chemical formula (3) is an example of the phosphorus-containing organic matter.

[Chem. 3]

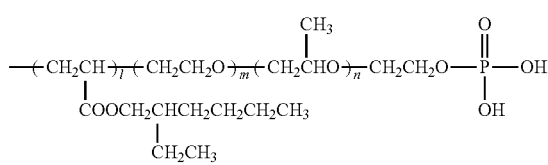

Chemical Formula (3)

In chemical formula (3), 1 is an integer in the range of 1 to 20, preferably an integer in the range of 1 to 15, and more preferably an integer in the range of 1 to 10, in is an integer in the range of 1 to 20, preferably an integer in the range of 1 to 15, and more preferably an integer in the range of 1 to 10, and n is an integer in the range of 1 to 20, preferably an integer in the range of 1 to 15, more preferably an integer in the range of 1 to 10.

The structure of polyethylene glycol (PEG), polypropylene glycol (PPG), polyimide, polyethylene terephthalate (PET), polyethersulfone (PES), polyethylene naphthalate (PEN), polyester, polycarbonate (PC), polyvinyl alcohol (PVA), polyvinyl butyral (PVB), polyacetal, polyarylate (PAR), polyamide (PA), polyamideimide (PAI), polyetherimide (PEI), polyphenylene ether (PPE), polyphenylene sulfide (PPS), polyether ketone (PEK), polyphthalamide (PPA), polyether nitrile (PENt), polybenzimidazole (PBI), polycarbodiimide, polysiloxane, polymethacrylamide, nitrile rubber, acrylic rubber, polyethylene tetrafluoride, epoxy resin, phenol resin, melamine resin, urea resin, polymethyl methacrylate resin (PMMA), polybutene, polypentene, ethylene-propylene copolymer, ethylene-butene-diene copolymer, polybutadiene, polyisoprene, ethylene-propylene-diene copolymer, butyl rubber, polymethylpentene (PMP), polystyrene (PS), styrene-butadiene copolymer, polyethylene (PE), polyvinyl chloride (PVC), polyvinylidene fluoride (PVDF), polyether ether ketone (PEEK), phenol novolac, benzocyclobutene, polyvinyl phenol, polychloropyrene, polyoxymethylene, polysulfone (PSF), polysulfide, silicone resin, aldose, cellulose, amylose, pullulan, dextrin, glucan, fructan, or chitin can be used as the organic structure of the phosphorus-containing organic material. A structure obtained by modifying a functional group of these structures can be used, a structure obtained by modifying these structures can be used, and a copolymer of these structures can also be used. A phosphorous-containing organic matter having a skeleton selected from a polyethylene glycol structure, a polypropylene glycol structure, a polyacetal structure, a polybutene structure, and a polysulfide structure is preferable because it can easily decompose, and it is unlikely to leave residue in a conductive pattern region obtained after sintering.

As specific examples of the phosphorus-containing organic matter, commercially available materials can be used. Specifically, examples thereof include, manufactured by BYK-Chemie, DISPERBYK™-102, DISPERBYK-103, DISPERBYK-106, DISPERBYK-109, DISPERBYK-110, DISPERBYK-111, DISPERBYK-118, DISPERBYK-140, DISPERBYK-145, DISPERBYK-168, DISPERBYK-180, DISPERBYK-182, DISPERBYK-187, DISPERBYK-190, DISPERBYK-191, DISPERBYK-193, DISPERBYK-194N, DISPERBYK-199, DISPERBYK-2000, DISPERBYK-2001, DISPERBYK-2008, DISPERBYK-2009, DISPERBYK-2010, DISPERBYK-2012, DISPERBYK-2013, DISPERBYK-2015, DISPERBYK-2022, DISPERBYK-2025, DISPERBYK-2050, DISPERBYK-2152, DISPERBYK-2055, DISPERBYK-2060, DISPERBYK-2061, DISPERBYK-2164, DISPERBYK-2096, DISPERBYK-2200, BYK™-405, BYK-607, BYK-9076, BYK-9077, and BYK-P105, and, manufactured by Daiichi Kogyo Seiyaku, PLYSURF™ M208F, and PLYSURF DBS. These may be used alone or a mixture of a plurality thereof may be used.

In the insulation region, the fine particles including copper oxide (hereinafter referred to as "copper oxide fine particles") and the phosphorus-containing organic matter coexist, and the content of the phosphorus-containing organic matter is 5 parts by volume to 900 parts by volume when the total volume of the copper oxide fine particles is 100 parts by volume. The lower limit is preferably 10 parts by volume or more, more preferably 30 parts by volume or more, and further preferably 60 parts by volume or more. The upper limit is preferably 480 parts by volume or less, and more preferably 240 parts by volume or less.

When converted to parts by weight, the content of the phosphorus-containing organic matter, relative to 100 parts by weight of the copper oxide fine particles, is preferably 1 part by weight to 150 parts by weight. The lower limit is preferably 2 parts by weight or more, more preferably 5 parts by weight or more, and further preferably 10 parts by weight or more. The upper limit is preferably 80 parts by weight or less, and more preferably 40 parts by weight or less.

As long as the content of the phosphorus-containing organic matter relative to the copper oxide fine particles is 5 parts by volume or more or 1 part by weight or more, a thin film having a sub-micron thickness can be formed. Furthermore, as long as the content of the phosphorus-containing organic matter is 10 parts by volume or more or 5 parts by weight or more, a thick film having a thickness of tens of μm can be formed as the layer. As long as the content of the phosphorus-containing organic matter is 30 parts by volume or more or 10 parts by weight or more, a highly flexible layer that does not easily crack even when bent can be obtained.

As long as the content of the phosphorus-containing organic matter relative to the copper oxide fine particles is 900 parts by volume or less or 150 parts by weight or less, a suitable conductive pattern region can be obtained by sintering.

(Hydrazine or Hydrazine Hydrate)

Hydrazine or hydrazine hydrate can be contained in the coating layer, and may remain in the insulation region, which is the unsintered region. By including hydrazine or hydrazine hydrate, the dispersion stability of copper oxide is further improved, and it contributes to copper oxide reduction during sintering, whereby the resistance of the conductive film is further reduced. The hydrazine content is as described below.

$$0.0001 \leq (\text{mass of hydrazine/mass of copper oxide}) \leq 0.10 \quad (1)$$

Regarding the content of the reducing agent, if the mass ratio of hydrazine is 0.0001 or more, the resistance of the copper film is reduced. Furthermore, if the mass ratio of hydrazine is 0.1 or less, the long-term stability of the copper oxide ink is increased, which is preferable.

(Mass Ratio of Copper Particles/Copper Oxide Fine Particles in Insulation Region)

Copper particles other than the copper oxide fine particles may be included in the insulation region. In this case, the mass ratio of the copper particles to the copper oxide fine particles (hereinafter referred to as "copper particles/copper oxide fine particles") is preferably in the range of 1.0 to 7.0.

It is preferable that the copper particles/copper oxide fine particles be in the range of 1.0 to 7.0 from the viewpoint of conductivity and the prevention of cracking.

(Average Particle Size of Copper Oxide Fine Particles)

The average secondary particle size of the copper oxide fine particles is not particularly limited, and is preferably 500 nm or less, more preferably 200 nm or less, and further preferably 80 nm or less. The average secondary particle size of the fine particles is preferably 5 nm or more, more preferably 10 nm or more, and further preferably 15 nm or more.

The average secondary particle size is the average particle size of agglomerates (secondary particles) formed by an agglomeration of a plurality of primary particles. It is preferable that the average secondary particle size be 500 nm or less since a fine conductive pattern region can be easily formed on the support. As long as the average secondary particle size is 5 nm or more, long-term stability of the dispersion is improved, which is preferable. The average secondary particle size of the fine particles can be measured with, for example, a transmission electron microscope or scanning electron microscope.

The average primary particle size of the primary particles constituting the secondary particles is preferably 100 nm or less, more preferably 50 nm or less, and further preferably 20 nm or less. The average primary particle size is preferably 1 nm or more, more preferably 2 nm or more, and further preferably 5 nm or more.

When the average primary particle size is 100 nm or less, the sintering temperature, which is described later, can be reduced. The reason why such a low temperature sinter is possible is considered to be that the smaller the particle diameter, the larger the surface energy and the lower the melting point.

Furthermore, as long as the average primary particle size is 1 nm or more, suitable dispersibility can be obtained. When a wiring pattern is formed on the support, from the viewpoint of adhesion to the substrate and low resistance, the average primary particle size is preferably 2 nm to 100 nm, and more preferably 5 nm to 50 nm. This tendency is remarkable when the substrate is resin. The average primary particle size of the fine particles can be measured with a transmission electron microscope or a scanning electron microscope.

The content of the copper oxide fine particles in the layer arranged on the support is preferably 40% by mass or more, more preferably 55% by mass or more, and further preferably 70% by mass or more relative to the unit mass of the region including copper oxide and phosphorus-containing organic matter. Furthermore, the content is preferably 98% by mass or less, more preferably 95% by mass or less, and further preferably 90% by mass or less.

Furthermore, the content of the copper oxide fine particles in the layer arranged on the support, per unit volume, is preferably 10% by volume or more, more preferably 15% by volume or more, and further preferably 25% by volume or more. Furthermore, the content is preferably 90% by volume or less, more preferably 76% by volume or less, and further preferably 60% by volume or less.

As long as the content of the copper oxide fine particles in the insulation region is 40% by mass or more or 10% by volume or more, the fine particles are fused together by sintering and exhibit conductivity, and the higher the concentration thereof, the higher the conductivity which can be achieved, which is preferable. As long as the content is 98% by mass or less or 90% by volume or less, the layer arranged on the support can adhere with the support or adhesion layer as a film, which is preferable. As long as the content is 95% by mass or less or 76% by volume or less, stronger adhesion with the support or adhesion layer can be achieved, which is preferable. As long as the content is 90% by mass or less or 60% by volume or less, the flexibility of the layer is increased, whereby cracking is less likely to occur upon folding, and reliability is increased. As long as the content of the of the copper oxide fine particles in the insulation region is 90% by volume or more, the insulation resistance value of the insulation region is reduced, whereby the electrical insulation thereof is excellent, which is preferable. The copper oxide may be cuprous oxide or cupric oxide. From the point of view of low resistance and absorbance, cuprous oxide is preferable.

As the copper oxide included in the insulation region according to the present embodiment, a commercial product may be used, or a composite may be used. Cuprous oxide fine particles having an average primary particle size of 18 nm sold by EM Japan is an example of a commercial product.

The following methods can be used as the method for synthesizing the fine particles including cuprous oxide.

(1) A method in which reduction is carried out by adding water and a copper acetylacetonate complex to a polyol solvent, dissolving the organic copper compound by heating, further adding a quantity of water necessary for the reaction thereto, and heating to the reduction temperature of the organic copper.

(2) A method in which an organic copper compound (copper-N-nitrosophenylhydroxylamine complex) is heated at a high temperature of about 300° C. in an inert atmosphere in the presence of a protective agent such as hexadecylamine.

(3) A method in which a copper salt which has been dissolved in an aqueous solution is reduced with hydrazine.

The method of (1) described above can be performed under the conditions described in Angewandte Chemie International Edition, 2001, no. 40, volume 2, p. 359.

The method of (2) described above can be performed under the conditions described in the Journal of the American Chemical Society, 1999, volume 121, p. 11595.

In the method of (3) described above, a divalent copper salt can suitable be used as the copper salt. Examples of the copper salt include copper(II) acetate, copper(II) nitrate, copper(II) carbonate, copper(II) chloride, and copper(II) sulfate. The amount of hydrazine used, relative to 1 mol of the copper salt, is preferably 0.2 mol to 2 mol, and more preferably 0.25 mol to 1.5 mol.

A water-soluble organic substance may be added to the aqueous solution in which the copper salt is dissolved. Since the melting point of the aqueous solution is lowered by adding a water-soluble organic substance thereto, reduction at a lower temperature becomes possible. As the water-soluble organic substance, for example, an alcohol or a water-soluble polymer can be used.

Methanol, ethanol, propanol, butanol, hexanol, octanol, decanol, ethylene glycol, propylene glycol, or glycerin can be used as the alcohol. Polyethylene glycol, polypropylene glycol, or a polyethylene glycol-polypropylene glycol copolymer can be used as the water-soluble polymer.

The temperature during reduction in method (3) described above can be, for example −20 to 60° C., and preferably −10 to 30° C. This reduction temperature may be constant during reaction, or the temperature may be raised or lowered. In the initial stage of the reaction when the activity of hydrazine is high, it is preferable that reduction be carried out at 10° C. or lower, and more preferably at 0° C. or lower. The reduction time is preferably 30 minutes to 300 minutes, more preferably 90 minutes to 200 minutes. The atmosphere during reduction is preferably an inert atmosphere such as nitrogen or argon.

Among methods (1) to (3) described above, the method of (3) is preferable since the operation thereof is easy and a small particle size can be obtained.

In the embodiments described above, copper oxide and phosphorus were included in the insulation region. In connection thereto, as alternative embodiments, copper oxide, and hydrazine or hydrazine hydrate can be included in the insulation region, or copper oxide, hydrazine or hydrazine hydrate, and phosphorus can be included in the insulation region. In other words, the layer may be configured such that conductive pattern regions including copper and insulation regions including copper oxide, and hydrazine or hydrazine hydrate are adjacent to each other. Alternatively, the layer may be configured such that conductive pattern regions including copper and insulation regions including copper oxide, hydrazine or hydrazine hydrate, and phosphorus are adjacent to each other, or configured such that conductive pattern regions including copper and phosphorus and insulation regions including copper oxide, hydrazine or hydrazine hydrate, and phosphorus are adjacent to each other.

Thus, in the present embodiment, hydrazine or hydrazine hydrate can be included in the insulation region. By including hydrazine or hydrazine hydrate in the coating layer, when light is incident thereon, the copper oxide can easily be reduced to copper. Since hydrazine or hydrazine hydrate is included therein, the resistance of the reduced copper can be reduced. Hydrazine or hydrazine hydrate remains in the insulation regions which are not irradiated with light.

(Conductive Pattern Region)

The copper in the conductive pattern region may exhibit a structure in which, for example, the fine particles including copper are fused to each other. Furthermore, the copper may be structured so as to not take the shape of the fine particles, but rather a state in which all of the fine particles are fused. Further, the copper may be structured such that a portion thereof takes the shape of the fine particles, and the greatest portion is in a fused state. The copper is preferable the reduced copper described above. Furthermore, the conductive pattern region preferably includes a sintered body in which the insulation region is sintered. As a result, the conductivity of the conductive pattern region can be increased. Furthermore, by sintering the insulation region, the conductive pattern region can be formed, whereby the conductive pattern region can be easily formed, and the "layer" according to the present embodiment, in which the conductive pattern regions and insulation regions are mixed, can be formed with high accuracy.

Furthermore, the conductive pattern region may include at least one of a copper oxide other than copper (cuprous oxide, cupric oxide, or copper (sub)oxide), elemental phosphorus, phosphorus oxide, and phosphorus-containing organic matter. For example, the portion of the conductive pattern regions on the surface side may have a structure in which the fine particles including copper are fused to each other, and the portion on the support side may have a structure including copper oxide or phosphorus-containing organic matter. As a result, the copper oxide or phosphorus-containing organic matter produces a strong bond between the copper particles, and further, the copper oxide or phosphorus-containing organic matter can increase the adhesion with the support or adhesion layer, which is preferable.

Regarding the content of elemental phosphorus in the conductive pattern region, the elemental concentration ratio of phosphorus/copper is preferably 0.02 to 0.30, more preferably 0.05 to 0.28, and further preferably 0.1 to 0.25. By making the elemental content ratio of phosphorus/copper 0.02 or more, copper oxidation can be suppressed, whereby and the reliability thereof as a copper wiring circuit can be improved, which is preferable. Furthermore, by making the elemental concentration ratio of phosphorus/copper 0.30 or less, the resistance of the conductive pattern region can be reduced, which is preferable.

As described above, the layer according to the present embodiment can have a structure in which conductive pattern regions including copper and phosphorus and insulation regions including copper oxide and phosphorus are adjacent to each other. As a result, the conductivity of the conductive pattern regions can be increased while simultaneously increasing the insulation of the insulation region. In the conductive pattern region, it is believed that since the phosphorus is oxidized before the copper is oxidized in the production processes, the change in resistance of the conductive pattern region can be restrained.

The content of the copper in the conductive pattern region is preferably, per unit volume, 50% by volume or more, more preferably 60% by volume or more, further preferably 70% by volume or more, and may be 100% by volume. By making the content of copper 50% by volume or more, the conductivity thereof is increased, which is preferable.

In the conductive pattern region, the surface which contacts a resin layer, which is described later, may have a roughness which is equal to or greater than a predetermined roughness. Specifically, the surface roughness Ra is preferably 20 nm to 500 nm, more preferably 50 nm to 300 nm, and further preferably 50 nm to 200 nm. By roughening to within this range, a part of the resin layer is received within the convex and concave portions of the conductive pattern region surface, whereby adhesion can be improved, which is preferable.

(Adhesion Layer)

In the structure having a wiring pattern region according to the present embodiment, the support preferably comprises an adhesion layer between the layers having a conductive pattern region. In other words, an adhesion layer is included on the surface constituted by the support, and the layer having a conductive pattern region is preferably arranged on the surface constituting the adhesion layer.

The surface constituted by the support is preferably roughened by the adhesion layer.

By roughening the surface constituted by the support, the copper oxide, phosphorus-containing organic matter, and copper in the layer arranged on the surface of the support can firmly adhere to the surface constituted by the support.

The adhesion layer may be formed by roughening the surface of the support by means of a rough polishing treatment, sandblasting treatment, chemical etching treatment, reactive ion etching treatment, plasma treatment, sputtering treatment, or UV-ozone treatment. Furthermore, the adhesion layer may be formed by roughening a surface formed by applying a coating material to the surface constituted by the support. The means for forming the adhesion layer can be appropriately selected in accordance with the material of the support.

(Coating Material)

Examples of the coating material include organic materials, inorganic materials, and organic-inorganic composite materials.

The coating material preferably includes a binding structure. Examples of the binding structure include a hydroxyl group (—OH group), amino group, thiol group, phosphoric acid group, phosphonic acid group, phosphonic acid ester group, functional group having a succinimide skeleton, functional group having a pyrrolidone skeleton, selenol group, polysulfide group, polyselenide group, carboxyl group, functional group having an acid anhydride skeleton, sulfonic acid group, nitro group, cyano group, isocyanate group, azide group, silanol group, silyl ether group, and hydrosilyl group. It is preferable that the binding structure be one or more selected from the group consisting of a hydroxyl group (—OH group), amino group, phosphonic acid group, and carboxylic acid group. The —OH group is more preferably an Ar—OH group (Ar represents an aromatic group) and/or a Si—OH group.

It is also preferable from the viewpoint of adhesion that the coating material have an Ar—O structure (Ar represents an aromatic group) and/or a Si—O structure.

The coating material may be an organic coating material represented in the following chemical group.

[Chem. 4]

Chemical Formula (4)

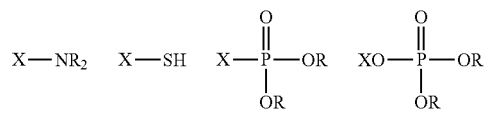

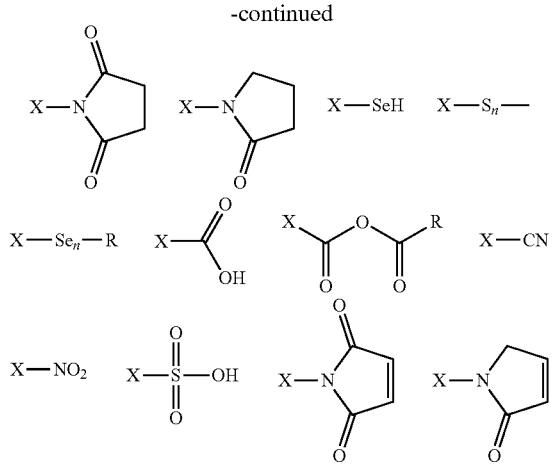

In the above chemical formula group, n is an integer of 1 or more, X is the main skeleton of the organic material, and R is a functional group. Examples of the functional group represented by R in the above chemical formula group include hydrogen, halogen, an alkyl group (e.g., methyl group, isopropyl group, tertiary butyl group, etc.), aryl group (e.g., phenyl group, naphthyl group, thienyl group, etc.), haloaryl group (e.g., pentafluorophenyl group, 3-fluorophenyl group, 3,4,5-trifluorophenyl group, etc.), alkenyl group, alkynyl group, amide group, acyl group, alkoxy group (e.g., methoxy group, etc.), aryloxy group (e.g., phenoxy group, naphthyl group, etc.), haloalkyl group (for example, perfluoroalkyl group, etc.), thiocyano group, hydroxyl group, amino group, thiol groups, phosphonic acid group, phosphonic acid ester group, functional group having a succinimide skeleton, functional group having a pyrrolidone skeleton, selenol group, polysulfide group, polyselenide group, carboxylic acid group, functional group having an acid anhydride skeleton, sulfonic acid group, nitro group, cyano group, and combination structures thereof. When the adhesion layer includes an organic material have such a binding structure, adhesion with the layer including the support and a conductive pattern region tends to be suitable.

An organic material including an aromatic structure (Ar) can be appropriately used as the organic material. Since the softening temperature and decomposition temperature of organic materials including an aromatic structure are high, deformation of the support during sintering can be suppressed, and tearing of the layer including a conductive pattern region arranged on the support by the decomposition gas of the support is unlikely to occur. Thus, a low-resistance conductive film can be obtained by sintering. An aromatic hydrocarbon such as benzene, naphthalene, anthracene, tetracene, pentacene, phenanthrene, pyrene, perylene, or triphenylene, or a heteroaromatic such as thiophene, thiazole, pyrrole, furan, pyridine, pyrazole, imidazole, pyridazine, pyrimidine, and pyrazine can be used as the aromatic structure. The number of electrons contained in the π-electron system of the aromatic structure is preferably 22 or less, more preferably 14 or less, and further preferably 10 or less. When the number of electrons contained in the π-electron system of the aromatic structure is 22 or less, the crystallinity does not become excessively high, whereby a flexible adhesion layer having high smoothness can be obtained. In these aromatic structures, a portion of the hydrogen bonded to the aromatic ring may be substituted with a functional group. Examples of the functional group include a halogen, an alkyl group (for example, a methyl group, isopropyl group, tertiary butyl group, etc.), an aryl group (for example, a phenyl group, naphthyl group, thienyl group, etc.), a haloaryl group (for example, a pentafluorophenyl group, a 3-fluorophenyl group, a 3,4,5-trifluorophenyl group, etc.), an alkenyl group, an alkynyl group, an amide group, an acyl group, an alkoxy group (for example, a methoxy group), an aryloxy group (for example, a phenoxy group, naphthyl group, etc.), a haloalkyl group (for example, a perfluoroalkyl group, etc.), a thiocyano group, or a hydroxyl group. It is preferable that the organic material include an aromatic hydroxyl group (Ar—OH group), and particularly preferably a phenol group (Ph-OH group). Furthermore, an organic material including an Ar—O structure in which an oxygen of the aromatic hydroxyl group is bonded to another structure is preferable since it contributes to decomposition resistance during sintering.

Examples of the organic material include polyimide, polyethylene terephthalate (PET), polyethersulfone (PES), polyethylene naphthalate (PEN), polyester, polycarbonate (PC), polyvinyl alcohol (PVA), polyvinyl butyral (PVB), polyacetal, polyarylate (PAR), polyamide (PA), polyamide-imide (PAI), polyetherimide (PEI), polyphenylene ether (PPE), polyphenylene sulfide (PPS), polyether ketone (PEK), polyphthalamide (PPA), polyether nitrile (PENt), polybenzimidazole (PBI), polycarbodiimide, polysiloxane, polymethacrylamide, nitrile rubber, acrylic rubber, polyethylene tetrafluoride, epoxy resins, phenol resins, melamine resins, urea resins, polymethyl methacrylate resins (PMMA), polybutene, polypentene, ethylene-propylene copolymers, ethylene-butene-diene copolymers, polybutadiene, polyisoprene, polychloroprene, ethylene-propylene-diene copolymers, nitrile rubber, chlorosulfonated polyethylene, acrylic rubber, epichlorohydrin rubber, urethane rubber, butyl rubber, fluoro rubber, polymethylpentene (PMP), polystyrene (PS), styrene-butadiene copolymers, polyethylene (PE), polyvinyl chloride (PVC), polyvinylidene fluoride (PVDF), polyetheretherketone (PEEK), phenol novolac, benzocyclobutene, polyvinyl phenol, polychloropyrene, polyoxymethylene, polysulfone (PSF) and silicone resins. It is preferable that the organic matter be at least one selected from the group consisting of phenol resins, phenol novolac, polyvinyl phenol, and polyimide.

Examples of the inorganic material include metals, alloys, metal oxides, metal nitrides, metal carbides, metal carbonates, and metal fluorides. Specific examples of the inorganic material include silicon oxide, silver oxide, copper oxide, aluminum oxide, zirconia, titanium oxide, hafnium oxide, tantalum oxide, tin oxide, calcium oxide, cerium oxide, chromium oxide, cobalt oxide, holmium oxide, lanthanum oxide, magnesium oxide, manganese oxide, molybdenum oxide, nickel oxide, antimony oxide, samarium oxide, terbium oxide, tungsten oxide, yttrium oxide, zinc oxide, indium oxide, indium tin oxide (ITO), silver fluoride, silicon fluoride, aluminum fluoride, zirconium fluoride, titanium fluoride, hafnium fluoride, tantalum fluoride, stannous fluoride, calcium fluoride, cerium fluoride, cobalt fluoride, fluoride holmium, lanthanum fluoride, magnesium fluoride, manganese fluoride, fluoride molybdenum, nickel fluoride, antimony fluoride, samarium fluoride, terbium fluoride, tungsten fluoride, yttrium fluoride, zinc fluoride, lithium fluoride, lead zirconate titanate (PZT), barium titanate, strontium titanate, copper nitride, silicon nitride, aluminum nitride, titanium nitride, hafnium nitride, tantalum nitride, tin nitride, calcium nitride, cerium nitride, cobalt nitride, holmium nitride, lanthanum nitride, magnesium nitride, manganese nitride, molybdenum nitride, nickel nitride, antimony nitride, samarium nitride, terbium nitride, tungsten nitride, yttrium nitride, zinc nitride, lithium nitride, gallium nitride, SiC, SiCN, and diamond-like carbon (DLC). An inorganic material including a hydroxyl group is preferable in terms of excellent adhesion between the support and the layer comprising a conductive pattern region. A metal oxide is particularly preferable since a hydroxyl group is present on the surface thereof. Among metal oxides, an inorganic material having a Si—O structure is more preferable.

More specifically, it is preferable that the inorganic material be at least one selected from the group consisting of silicon oxide, titanium oxide, zirconia, indium tin oxide, and aluminum oxide. Silicon oxide and aluminum oxide are particularly preferable.

Furthermore, it is preferable that the adhesion layer include fine particles having a particle size in the range of 10 nm to 500 nm. Specifically, it is preferable that the adhesion layer have fine particles of silicon oxide or aluminum oxide having a particle size in the range of 10 nm to 500 nm. As a result, the specific surface area when the layer including a conductive pattern region can be increased, and adhesion with the layer including a conductive pattern region can be increased. The fine particles may be porous particles.

An inorganic semiconductor can be used as the inorganic material. Examples of the inorganic semiconductor material include single element semiconductors, oxide semiconductors, compound semiconductors, and sulfide semiconductors. Examples of single element semiconductors include silicon and germanium. Examples of oxide semiconductors include IGZO (indium-gallium-zinc oxide), IZO (indium-zinc oxide), zinc oxide, indium oxide, titanium oxide, tin oxide, tungsten oxide, niobium oxide, and cuprous oxide. Examples of compound semiconductors include gallium arsenide (GaAs), gallium arsenide phosphorus (GaAsP), gallium phosphide (GaP), cadmium selenium (CdSe), silicon carbide (SiC), indium antimony (InSb), and gallium nitride. Examples of sulfide semiconductors include molybdenum sulfide and cadmium sulfide.

Organic materials in which inorganic fine particles are dispersed and organic metal compounds can be used as the organic-inorganic composite material. Particles of the inorganic materials described above can be used as the inorganic fine particles. Examples of organic metal compounds include silicates, titanates, aluminates. Methyl silicate and ethyl silicate can be used as the silicate.

Furthermore, the thickness of the adhesion layer is preferable 20 μm or less. As a result, warping of the support can be prevented. Furthermore, the film thickness of the adhesion layer is more preferably 10 μm or less, and further preferably 1 μm or less, and from the viewpoint of adhesiveness, the film thickness is preferably 0.01 μm or more, more preferably 0.05 μm or more, and further preferably 0.1 μm or more.

(Primer Material)

The adhesion layer may be formed of a single material, or may be formed by mixing or laminating a plurality of types of materials. For example, the adhesion layer may include a primer material. Furthermore, a layer composed of the primer material may be arranged, for example, between the support and the layer composed of the coating material, or between the layer composed of the coating material and the layer including a conductive pattern region.

If the adhesion layer includes a layer composed of the primer material, adhesion can be better improved. The layer composed of the primer material can be formed by, for example, a primer treatment in which a thin primer material layer is formed on the surface.

The primer material preferably includes a binding structure. Examples of the binding structure include the binding structures described in the section "(Coating Material)" above. By including a binding structure in the primer material, the binding structure enters the adhesion layer, whereby high adhesion can be obtained.

The adhesion layer may be formed by arranging the layer composed of the coating material on the support after the primer treatment has been applied thereto. Alternatively, the adhesion layer may be formed by arranging the layer composed of the coating material on the support and thereafter applying the primer treatment to the layer. Additionally, the adhesion layer may be formed by pre-mixing the coating material and primer material and thereafter arranging the mixture on the support, and the adhesion layer may be formed by arranging the layer composed of the primer material on the support. Since the density of the surface bonding structure can be increased when the primer treatment is applied to the layer composed of the coating material, high adhesion can be obtained.

Examples of the primer material include silane coupling agents, phosphonic acid-based low-molecular materials, and thiol-based materials.

Examples of silane coupling agents include compounds including a functional group such as a vinyl group, amino group, epoxy group, styryl group, methacryl group, acrylic group, isocyanurate group, ureido group, thiol group, isocyanate group, phosphonic acid group at the terminal thereof. Specifically, examples of silane coupling agents include vinylmethoxysilane, vinylethoxysilane, 2-(3,4-epoxycyclohexyl) ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene) propylamine, N-phenyl-3-aminopropyltrimethoxysilane, N-(vinylbenzyl)-2-aminoethyl-3-aminopropyltrimethoxysilane hydrochloride, tris-(trimethoxysilylpropyl) isocyanurate, 3-ureidopropyltrialkoxysilane, 3-mercaptopropylmethyldimethoxysilane, 3-mercaptopropyltrimethoxysilane, and 3-isocyanatopropyltriethoxysilane.

Examples of phosphonic acid-based low-molecular materials include compounds including a functional group such as a vinyl group, amino group, epoxy group, styryl group, methacryl group, acrylic group, isocyanurate group, ureido group, thiol group, isocyanate group, silyl group, silanol group, silyl ether group at the terminal thereof. Specifically, examples of phosphonic acid-based low-molecular materials include aminomethylphosphonic acid, 2-aminoethylphosphonic acid, O-phosphorylethanolamine, 12-aminododecylphosphonic acid, 12-aminoundecylphosphonic acid hydrochloride, 6-aminohexylphosphonic acid, 6-aminohexylphosphonic acid hydrochloride, 12-azidododecylphosphonic acid, (12-dodecylphosphonic acid)N,N-dimethyl-N-octadecylammonium bromide, (12-dodecylphosphonic acid) N,N-dimethyl-N-octadecylammonium chloride, (12-dodecylphosphonic acid) pyridinium bromide, (12-dodecylphosphonic acid) triethylammonium bromide, (12-dodecylphosphonic acid) triethylammonium chloride, 11-hydroxyundecylphosphonic acid, 12-mercaptododecylphosphonic acid, 11-mercaptoundecylphosphonic acid, 11-methacryloyloxyundecylphosphonic acid, 4-nitrobenzylphosphonic acid, 12-phosphono-1-dodecanesulfonic acid, (6-phosphonohexyl) phosphonic acid, 11-phosphonoundecanoic acid, 11-phosphonoundecyl acrylate, propylene diphosphonic acid, 4-aminobenzylphosphonic acid, 1,8-octanediphosphonic acid, 1,10-decyldiphosphonic acid, 6-phosphonohexanoic acid, (1-amino-2-methylpropyl) phosphonic acid, (1-aminopropyl) phosphonic acid, (3-nitrophenyl) phosphonic acid, 1-hydroxyethane-1,1,-diphosphonic acid, 3-aminopropylphosphonic acid, 4-aminobutylphosphonic acid, nitrilotris (methylene) triphosphonic acid, and methylenediphosphonic acid.

A compound including a functional group such as a vinyl group, amino group, epoxy group, styryl group, methacryl group, acrylic group, isocyanurate group, ureido group, isocyanate group, silyl group, silanol group, silyl ether group, phosphonic acid group at the terminal thereof can be suitably used as the thiol-based material. Specifically, examples of the thiol-based material include 4-cyano-1-butanethiol, 1,11-undecanedithiol, 1,16-hexadecanedithiol, 1,2-ethanedithiol, 1,3-propanedithiol, 1,4-butanedithiol, 1,5-pentanedithiol, 1,6-hexanedithiol, 1,8-octanedithiol, 1,9-nonanedithiol, 2,2'-(ethylenedioxy) diethanethiol, 2,3-butanedithiol, 5,5'-bis(mercaptomethyl)-2,2'-bipyridine, hexa(ethylene glycol) dithiol, tetra(ethylene glycol) dithiol, benzene-1,4-dithiol, (11-mercaptoundecyl)hexa(ethylene glycol), (11-mercaptoundecyl)tetra(ethylene glycol), 1-mercapto-2-propanol, 11-amino-1-undecanethiol, 11-amino-1-undecanethiol hydrochloride, 11-azido-1-undecanethiol, 11-mercapto-1-undecanol, 11-mercaptoundecanamide, 11-mercaptoundecanoic acid, 11-mercaptoundecylhydroquinone, 11-mercaptoundecylphosphonic acid, 12-mercaptododecanoic acid, 16-amino-1-hexadecanethiol, 16-amino-1-hexadecanethiol hydrochloride, 16-mercaptohexadecanamide, 16-mercaptohexadecanoic acid, 3-amino-1-propanethiol, 3-amino-1-propanethiol hydrochloride, 3-mercapto-1-propanol, 3-mercaptopropionic acid, 4-mercapto-1-butanol, 6-amino-1-hexanethiol, 6-amino-1-hexanethiol hydrochloride, 6-mercapto-1-hexanol, 6-mercaptohexanoic acid, 8-amino-1-octanethiol, 8-amino-1-octanethiol hydrochloride, 8-mercapto-1-octanol, 8-mercaptooctanoic acid, 9-mercapto-1-nonanol, 1,4-benzenedimethanethiol, 4,4'-bis(mercaptomethyl) biphenyl, 4,4'-dimercaptostilbene, 4-mercaptobenzoic acid, and biphenyl-4,4-dithiol.

Examples of the method for forming the layer composed of the coating material include application, vapor deposition, and sol-gel methods. The thickness of the layer composed of the coating material is preferably, from the viewpoint of preventing warping of the support, 20 μm or less, more preferably 10 μm or less, and further preferably 1 μm or less. From the viewpoint of adhesiveness, the thickness of the layer composed of the coating material is preferably 0.01 μm or more, more preferably 0.05 μm or more, and further preferably 0.1 μm or more.

In the present embodiment, when the support comprises an adhesion layer, the phosphorus-containing organic matter may include one or more types of binding structures. Examples of binding structures include the binding structures described in the section "(Coating Material)" above. It is particularly preferable that at least one selected from the group consisting of hydroxyl groups, amino groups, phosphonic acid groups, phosphonic acid ester groups, and isocyanate groups be included as the binding structure. When the layer including a conductive pattern region includes phosphorus-containing organic matter having such a binding structure, adhesiveness with the adhesion layer is suitable.

Figure 3:
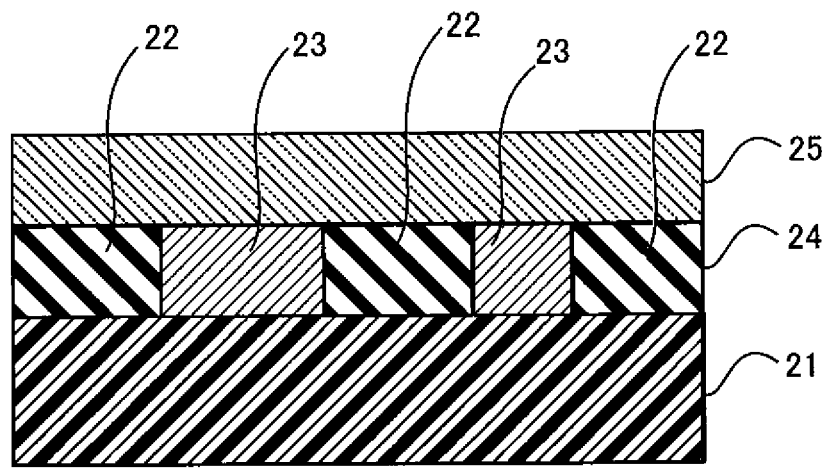
FIG. 3 is a cross-sectional schematic view showing a structure comprising a conductive pattern region according to a second embodiment.

Configuration of Structure Comprising Conductive Pattern Region: Second Embodiment FIG. 3 is a cross-sectional schematic view showing the structure comprising a conductive pattern region according to the second embodiment. As shown in FIG. 3, the structure 20 comprising a conductive pattern region comprises a support 21, and a layer 24 arranged on the surface constituted by the support 21. Further, in the layer 24, an insulation region 22 including copper oxide and phosphorus and a conductive pattern region 23 including reduced copper are arranged adjacent to each other. Moreover, an oxygen barrier layer 25 is provided so as to cover the layer 24. The oxygen barrier layer 25 is light transmissive.

The insulation region 22 may include copper oxide, and hydrazine or hydrazine hydrate, and alternatively, may include copper oxide, phosphorus, and hydrazine or hydrazine hydrate. Furthermore, the conductive pattern region 23 may include copper and phosphorus. In the present embodiment, the layer 24 can have a structure in which a conductive pattern region 23 including copper and an insulation region including copper oxide and phosphorus are adjacent to each other, a structure in which a conductive pattern region 23 including copper and an insulation region 22 including copper oxide, and hydrazine or hydrazine hydrate are adjacent to each other, or a structure in which a conductive pattern region 23 including copper and phosphorus and an insulation region including copper oxide and phosphorus are adjacent to each other. Alternatively, the layer 24 can have a structure in which a conductive pattern region 23 including copper and an insulation region 22 including copper oxide, hydrazine or hydrazine hydrate, and phosphorus are adjacent to each other, or a structure in which a conductive pattern region 23 including copper and phosphorus and an insulation region 22 including copper oxide, hydrazine or hydrazine hydrate, and phosphorus are adjacent to each other.

The structure 20 according to the second embodiment differs from the structure 10 according to the first embodiment in that a resin layer (oxygen barrier layer 25) is included therein.

Due to the structure of the second embodiment, the area between the conductive pattern regions including copper can be insulated by the insulation region including copper oxide and phosphorus-containing organic matter, whereby it is not necessary to remove unsintered portions of the layer 24 during production. Thus, the production process can be simplified, and since a solvent or the like is not necessary, production costs can be reduced. Furthermore, an insulation region is used to insulate the conductive pattern regions, whereby the occurrence of cracking is reduced and reliability is improved.

Further, since the layer 24 is covered with a resin layer (oxygen barrier layer 25), the conductive pattern region and the insulation region can be protected from external stresses, whereby the long-term reliability of the structure comprising a conductive pattern region can be improved.

The structures of the support 11, insulation region 12, conductive pattern region 13, and layer 14 described above can be adopted as the structures of the support 21, insulation region 22, conductive pattern region 23, and layer 24 constituting the structure 20. Furthermore, the structure 20 can include the adhesion layer described above.

The resin layer will be described in detail.

<Resin Layer>

As shown in FIG. 3, a resin layer is arranged so as to cover the surface of the layer 24.

(Oxygen Barrier Layer)

The oxygen barrier layer 25 is one example of the resin layer. In the method for the production of the structure 20, which is described later, the oxygen barrier layer 25 can prevent contact of oxygen with the coating layer (described later) during irradiation, and can promote the reduction of the copper oxide. As a result, during irradiation, equipment for an oxygen-free or low-oxygen atmosphere, for example, a vacuum atmosphere or an inert gas atmosphere, around the coating layer becomes unnecessary, whereby production cost can be reduced.

Furthermore, the oxygen barrier layer 25 can prevent the peeling or scattering of the conductive pattern region 23 by the heat of irradiation or the like. As a result, the structure 20 can be produced with a high yield.

(Sealing Material Layer)

Figure 4:
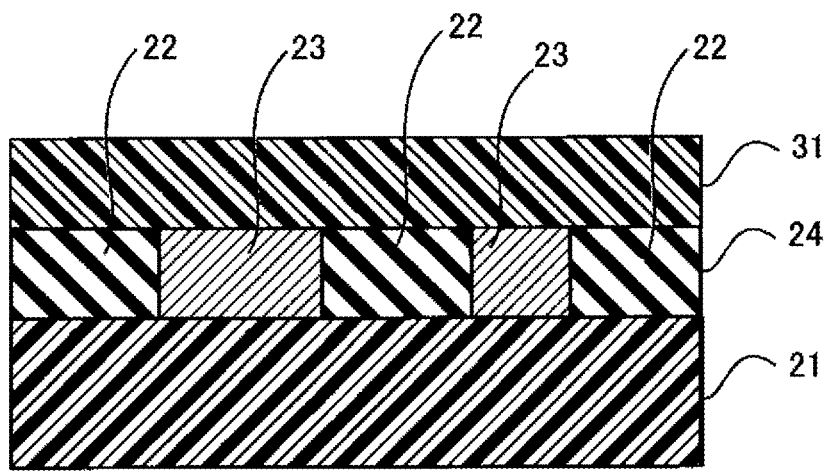
FIG. 4 is a cross-sectional schematic view showing a structure comprising a conductive pattern region which is partially different from that of FIG. 3.

A sealing material layer is another example of the resin layer. FIG. 4 is a cross-sectional schematic view partially different from FIG. 3 showing another example of a structure comprising a conductive pattern region. The structure 30 comprising a conductive pattern region shown in FIG. 4 is identical to the structure 20 shown in FIG. 3 except that in place of the oxygen barrier layer 25 (refer to FIG. 3), a sealing material layer 31 covers the surface of the layer 24.

The sealing material layer 31 is newly arranged after, for example, peeling of the oxygen barrier layer 25.

The oxygen barrier layer 25 (refer to FIG. 3) plays an important role primarily during production. In connection thereto, the sealing material layer 31, in a produced final product (the structure 30 comprising a conductive pattern region and products provided with the same), protects the conductive pattern region 23 from external stresses, whereby the long-term stability of the structure 30 comprising a conductive pattern region can be improved.

In this case, the sealing material layer 31, which is an example of the resin layer, preferably has a moisture permeability of 1.0 $g/m^2/day$ or less. This ensures long-term stability, and by sufficiently reducing moisture penetration, the penetration of the sealing material layer by external moisture can be prevented, whereby oxidation of the conductive pattern region 23 can be suppressed.

The sealing material layer 31 is an example of a functional layer that provides a function to the structure 30 comprising a conductive pattern region after the oxygen barrier layer 25 has been peeled. Additionally, scratching resistance when the structure 30 comprising a conductive pattern region is handled and protection against external contamination can be imparted thereby, and by using a strong resin, rigidity can be imparted to the structure 20.

It should be noted that in the present description, functional layers other than the oxygen barrier layer, such as a sealing material layer, will be referred to simply as "another resin layer."

In the present embodiment, the case in which, in the method for the production (described later) of the structure comprising a conductive pattern region, the oxygen barrier layer 25 (refer to FIG. 3) is arranged so as to cover the coating layer, the oxygen barrier layer 25 is removed after a light sintering treatment, and the sealing material layer 31 (refer to FIG. 4), which is an example of another resin layer, is arranged so as to cover the layer 24 has been described as an example. In other words, the structure 20 (refer to FIG. 3) can be referred to as a precursor structure for obtaining the structure 30 comprising a conductive pattern region (refer to FIG. 4) as a final product. However, the structure 20 (refer to FIG. 2), in which the oxygen barrier layer 25 remains as-is, may be used as-is as a final product.

The resin constituting the resin layer described above preferably has a melting point in the range of 150° C. to 300° C. By using such a resin, a safety factor more than twice the actual operating temperature range (maximum 75° C.) can be ensured, and heat-melting and laminate-coating can be achieved during formation of the resin layer, which is preferable.

It is preferable that an aperture be provided in the resin layer. The aperture is for performing external electrical connection with the conductive pattern region, whereby an electrical contact can be attached to the aperture by a method such as metal plating or soldering.

The resin layer will be described in greater detail. First, the oxygen barrier layer will be described. The oxygen barrier layer prevents the penetration of external oxygen into the coating layer during irradiation with light. For example, the following materials can be used as the material of the oxygen barrier layer. A resin material composed of polypropylene (PP), polyimide (PI), polyethylene terephthalate (PET), polyethersulfone (PES), polyethylene naphthalate (PEN), polyester, polycarbonate (PC), polyvinyl alcohol (PVA), polyvinyl butyral (PVB), polyacetal (POM), polyarylate (PAR), polyamide (PA), polyamideimide (PAI), polyetherimide (PEI), polyphenylene ether (PPE), modified polyphenylene ether (m-PPE), polyphenylene sulfide (PPS), polyether ketone (PEK), polyphthalamide (PPA), polyether nitrile (PENt), polybenzimidazole (PBI), polycarbodiimide, polysiloxane, polymethacrylamide, nitrile rubber, acrylic rubber, polyethylene tetrafluoride, epoxy resin, phenol resin, melamine resin, urea resin, polymethyl methacrylate resin (PMMA), polybutene, polypentene, an ethylene-propylene copolymer, an ethylene-butene-diene copolymer, polybutadiene, polyisoprene, an ethylene-propylene-diene copolymer, butyl rubber, polymethylpentene (PMP), polystyrene (PS), a styrene-butadiene copolymer, polyethylene (PE), polyvinyl chloride (PVC), polyvinylidene fluoride (PVDF), polyetheretherketone (PEEK), phenol novolac, benzocyclobutene, polyvinyl phenol, polychloropyrene, polyoxymethylene, polysulfone (PSF), polyphenylsulfone resin (PPSU), a cycloolefin polymer (COP), acrylonitrile-butadiene-styrene resin (ABS), acrylonitrile-styrene resin (AS), nylon resin (PA6, PA66), polybutyl terephthalate resin (PBT), polyether sulfone resin (PESU), polytetrafluoroethylene resin (PTFE), polychlorotrifluoroethylene (PCTFE), and silicone resin can be used.

Furthermore, the oxygen barrier layer may be bonded with the coating layer by providing an adhesive layer between the oxygen barrier layer and the coating layer.

Next, another resin layer will be described. The sealing material layer, which is an example of another resin layer, ensures long-term stability. The sealing material layer preferably has sufficiently low moisture permeability. The sealing material layer prevents the penetration of external moisture to suppress oxidation of the conductive pattern region. The moisture permeability of the sealing material layer is preferably 1.0 $g/m^2/day$ or less, more preferably 0.5 $g/m^2/day$ or less, and further preferably 0.1 $g/m^2/day$ or less. By using a sealing material layer having a moisture permeability within this range, changes in resistance due to oxidation of the conductive pattern region can be suppressed in, for example, a long-term stability test in an environment of 85° C. and 85% RH.

The materials which can be used as the sealing material layer can be selected from, for example, among the materials of the oxygen barrier layer described above, and furthermore, the moisture permeability thereof can be lowered by mixing of silicon oxide or aluminum oxide fine particles into these materials, or providing a layer composed of silicon oxide or aluminum oxide on the surface of those materials as a moisture barrier layer.

Furthermore, it is not necessary that the sealing material layer be composed of a single material. A plurality of the materials described above may be used.

The structure comprising a conductive pattern region described above is produced using a stack as an intermediate, which will be described next. In other words, to obtain a desired structure comprising a conductive pattern region, it is necessary to optimize the structure of the stack as an intermediate. The structure of the stack according to the present embodiment will be described below.

Summary of Stack of Present Embodiment

The present inventors have discovered that when a conductive pattern region is formed by arranging a coating layer including copper oxide on a surface of a support, selectively irradiating the coating layer to reduce the copper oxide to copper, as long as the electrical insulation of the region including unreduced copper oxide is high, by leaving the region as-is without removal, insulation between the conductive pattern regions can be ensured, and a process for removing the region is not necessary.

Further, it has been discovered that by arranging a resin layer on the coating layer, equipment for producing a vacuum atmosphere or inert gas atmosphere is not necessary when performing a treatment in which the copper oxide is sintered by means of irradiation with light (hereinafter referred to as a "light sintering treatment"), whereby the production costs of the structure comprising a conductive pattern region described above can be reduced. Thus, the present invention has been completed.

Figure 5:
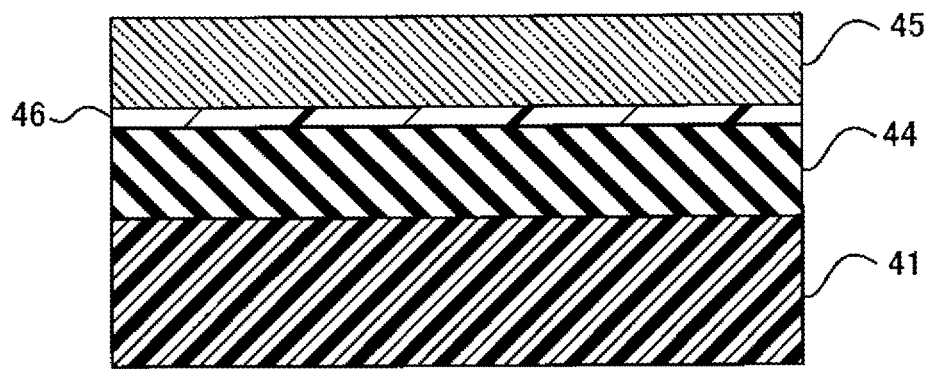
FIG. 5 is a cross-sectional schematic view showing an example of the stack according to the present embodiment.

Specifically, the stack 40 according to the present embodiment comprises, as shown in FIG. 5, a support 41, a coating layer 44 including copper oxide and phosphorus arranged on the surface constituted by the support 41, and an oxygen barrier layer 45, which is an example of a resin layer, arranged so as to cover the coating layer 44. The oxygen barrier 45 is light transmissive.

As shown in FIG. 5, an adhesive layer 46 is arranged between the coating layer 44 and the oxygen barrier layer 45 as needed.

As shown in FIG. 5, since the coating layer 44 covers the resin layer (oxygen barrier layer 45), the coating layer 44 prevents contact with oxygen during light sintering, whereby the reduction of the copper oxide can be promoted. As a result, equipment for producing an oxygen-free or low-oxygen atmosphere around the coating layer 44 during light irradiation is not necessary, whereby production costs can be reduced. Thus, by using the stack according to the present embodiment, a stack having a desired conductive pattern region can be produced at high efficiency and low cost.

Regarding the support 41 and resin layer (for example, the oxygen barrier layer 45 in FIG. 5) constituting the stack 40, the structures of the support 11 and resin layer (oxygen barrier layer 25) described above can be adopted. Furthermore, in the stack 40, the adhesion layer described above can be included between the support 41 and the coating layer 44.

The coating layer 44 and the adhesive layer 46 will be described in detail below.

<Coating Layer>

The coating layer 44 is formed by coating the surface constituted by the support 41 with a dispersion in which a dispersion medium using phosphorus, particularly phosphorus-containing organic matter which functions as a dispersant for copper oxide, is dispersed.

The details of the production methods of the phosphorus-containing organic matter, the dispersion medium, and the dispersion are described later.

The coating layer 44 is structured so as to have substantially the same composition as the insulation region 22 of FIG. 3.

Furthermore, like the insulation regions 12, 22 shown in FIGS. 1 and 3, in the coating layer 44, fine particles including copper oxide and phosphorus-containing organic matter are mixed, and the content of the phosphorus-containing organic matter, when the total volume of the copper oxide fine particles is 100 parts by volume, is preferably in the range of 5 parts by volume to 900 parts by volume. As a result, a coating layer 44 which is highly flexible and unlikely to crack when bent, and in which suitable conductive pattern regions can be formed by sintering can be obtained.

Furthermore, it is preferable that the coating layer 44 further comprise copper particles, and the copper particles/copper oxide fine particles mass ratio in the coating layer is preferably in the range of 1.0 to 7.0. As a result, the occurrence of cracks can be suppressed, and a suitable conductive pattern region can be formed by sintering.

Furthermore, the content ratio of copper oxide fine particles in the coating layer 44 is preferably in the range of 10% by volume to 90% by volume. As a result, when the coating layer 44 is sintered, the fine particles fuse to each other, whereby conductivity can be easily developed. Furthermore, the coating layer 44 can be effectively attached to the support or adhesion layer.

Furthermore, the average particle size (average primary particle size) of the copper oxide fine particles contained in the coating layer 44 is preferably in the range of 1 nm to 50 nm. As a result, the sintering temperature for the coating layer 44 can be reduced, and the dispersibility of the copper oxide fine particles within the coating layer 44 can be improved.

Furthermore, the coating layer 44 may have a structure including copper oxide, and hydrazine or hydrazine hydrate, or a structure including copper oxide, phosphorus-containing organic matter, and hydrazine or hydrazine hydrate. By including hydrazine or hydrazine hydrate, reduction of the copper oxide to copper when exposed to light is promoted.

<Adhesive Layer>

The adhesive layer 46 is arranged between the coating layer 44 and the oxygen barrier layer 45 as needed, and bonds the oxygen barrier layer 45 to the surface of the coating layer 44.

The adhesive strength of the adhesive layer 46 is preferably in the range of 5 mN/10 mm to 10 N/10 mm. By setting the adhesive strength in the range of 5 mN/10 mm or more to less than 1 N/10 mm, the oxygen barrier layer 45 can be affixed to the coating layer 44 via the adhesive layer 46, and the oxygen barrier layer 45 can be easily peeled in subsequent processes. Further, by setting the adhesive strength in the range of 1 N/10 mm to 10 N/10 mm, the oxygen barrier layer 45 can be firmly affixed to the coating layer 44 via the adhesive layer 46.

The adhesive layer 46 is an adhesive sheet, adhesive film, or adhesive material. The adhesive included in the adhesive layer 46 is not particularly limited. Examples of the adhesive include acrylate resins, epoxy resins, and silicone resins.

When the oxygen barrier layer 45 is a resin film comprising the adhesive layer 46, the oxygen barrier layer 45 can be conveniently formed by bonding the resin film to the surface of the coating layer 44. Furthermore, by selecting the adhesive strength as described above, the oxygen barrier layer 45 can be peeled as needed. By peeling the oxygen barrier layer 45 in this manner, a structure 10 having a configuration as shown in FIG. 2 can be obtained.

It should be noted that when the oxygen barrier layer 45 is a layer formed from a cured resin or a layer formed by heating and pressure laminating a thermoplastic resin, the adhesive layer can be omitted.

Furthermore, in the present embodiment, it is preferable that a layer including silicon oxide or aluminum oxide be included between the coating layer 44 and the resin layer. The layer including silicon oxide or aluminum oxide can serve as a moisture barrier layer, whereby moisture permeability can be reduced.

Figure 6:
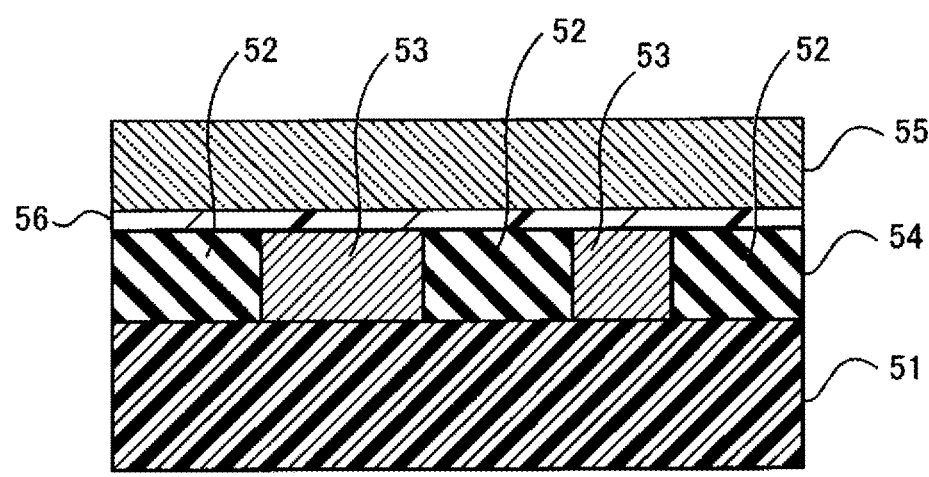
FIG. 6 is a cross-sectional schematic view showing an example of a structure comprising a conductive pattern region produced using the stack according to the present embodiment.

FIG. 6 is a cross-sectional view of a structure 50 comprising a conductive pattern region formed using the stack shown in FIG. 5. As shown in FIG. 6, the structure 50 comprising a conductive pattern region comprises a support 51, a layer 54 in which an insulation region 52 including copper oxide and phosphorus-containing organic matter and a conductive pattern region 53 including reduced copper are arranged on a surface constituted by the support 51 so as to be adjacent to each other, an oxygen barrier layer 55, which is an example of a resin layer, which is provided so as to cover the layer 54, and an adhesive layer 56 interposed between the layer 54 and the oxygen barrier layer 55.

Though the structure 50 comprising a conductive pattern region shown in FIG. 6 has basically the same structure as the structure 20 shown in FIG. 3, they differ in that, in FIG. 6, the adhesive layer 56 is interposed between the layer 54 and the oxygen barrier layer 55. In FIG. 6, due to the including of the adhesive layer 56, adhesion between the oxygen barrier layer 55 and the layer 54 can be improved, whereby a structure 50 comprising a conductive pattern region which is excellent in durability can be realized. Furthermore, by interposing a layer including silicon oxide or aluminum oxide between the oxygen barrier layer 55 and the layer 54, the moisture barrier properties can be improved.

Furthermore, in FIG. 6, the oxygen barrier layer 55 can be replaced with another resin layer as needed. At this time, by using an adhesive having a weak adhesive force in the adhesive layer 56, the oxygen barrier layer 55 can be easily peeled from the layer 54. The adhesive layer 56 or a layer including silicon oxide or aluminum oxide can be interposed between the other resin layer and the layer 54. When another layer is directly bonded to the surface of the layer 54 without an intervening adhesive layer 56 or layer including silicon oxide or aluminum oxide, a structure 50 comprising a conductive pattern region according to the configuration shown in FIG. 3 is obtained.

Summary of Copper Wiring of Present Embodiment

The present inventors have developed copper wiring composed of the conductive pattern region in the structure described above. In other words, in the present embodiment, the conductive pattern region of the layer in which the conductive pattern region and the insulation region are adjacent is the copper wiring described below. Furthermore, in the present embodiment, the copper wiring can be obtained by removing the insulation region.

The copper wiring according to the present embodiment comprises reduced copper, which is obtained by reducing copper oxide, phosphorus, and carbon. Further, the phosphorus/copper elemental concentration ratio is 0.02 to 0.30, and the carbon/copper elemental concentration ratio is 1.0 to 6.0. The arithmetic average roughness Ra of the surface of the copper wiring is preferably 20 nm to 500 nm.

It is preferable that the content ratio of elemental phosphorus to elemental copper, as described above, be in the range of 0.02 to 0.30, more preferably in the range of 0.05 to 0.28, and further preferably in the range of 0.1 to 0.25. By making the phosphorus/copper elemental concentration 0.02 or more, oxidation of the copper can be suppressed and the reliability thereof as a copper wiring circuit can be improved, which is preferable. Furthermore, by making the phosphorus/copper elemental concentration 0.30 or less, the resistance value of the wiring can be reduced, which is preferable.

It is preferable that the content ratio of elemental carbon to elemental copper, as described above, be in the range of 1.0 to 6.0, more preferably in the range of 1.5 to 5.5, and further preferably in the range of 2.0 to 5.0. By making the carbon/copper elemental concentration 1.0 or more, flexibility can be imparted to the copper wiring. Furthermore, by making the carbon/copper elemental concentration 6.0 or less, the resistance value of the wiring can be reduced, which is preferable.

The carbon is derived from residues generated when organic components such as the phosphorus-containing organic matter and glycols in the coating layer reduce the copper oxide.

As described above, Ra is preferably 20 nm to 500 nm, more preferably 50 nm to 300 nm, and further preferably 50 nm to 200 nm. Ra is the arithmetic average roughness of the surface of the copper wiring, and represents the surface roughness of the surface which contacts the resin layer when the copper wiring is covered by the resin layer. By making Ra 20 nm to 500 nm, adhesion with the resin layer can be improved, which is preferable.

Further, the copper wiring may include nitrogen. The nitrogen/copper elemental concentration ratio is preferably 0.04 to 0.6, more preferably 0.1 to 0.55, and further preferably 0.2 to 0.5. By making the nitrogen/copper elemental concentration ratio 0.04 or more, the corrosion resistance of the copper wiring can be improved, and by making the nitrogen/copper elemental concentration ratio 0.6 or less, the resistance value of the wiring can be reduced, which is preferable. The nitrogen is derived from residuals generated when the hydrazine or hydrazine hydrate in the coating layer is reduced.

The copper wiring comprises reduced copper, which is obtained by reducing copper oxide, phosphorus, and carbon, and the elemental concentration ratio phosphorus:carbon:copper is preferably in the range of 0.02:1:1 to 0.3:6:1, more preferably 0.05:1.5:1 to 0.28:5.5:1, and further preferably 0.1:2:1 to 0.25:5:1. It should be noted that the aforementioned ranges are ratios in which the elemental concentration of copper is specified as 1. By including reduced copper, phosphorus, and carbon in theses ranges, the resistance value of the wiring can be reduced, oxidation of the copper can be suppressed, and the flexibility of the copper can be supported to the greatest degree possible.

The copper wiring comprises reduced copper, which is obtained by reducing copper oxide, phosphorus, carbon, and nitrogen, and the elemental concentration ratio phosphorus:carbon:nitrogen:copper is preferably in the range of 0.02:1:0.04:1 to 0.3:6:0.6:1, more preferably 0.05:1.5:0.1:1 to 0.28:5.5:0.55:1, and further preferably 0.1:2:0.2:1 to 0.25:5:0.5:1. It should be noted that the aforementioned ranges are ratios in which the elemental concentration of copper is specified as 1. By including reduced copper, phosphorus, carbon, and nitrogen in these ranges, the resistance value of the wiring can be reduced, oxidation of the copper can be suppressed, and the corrosion resistance of the copper can be supported to the greatest degree possible.

Next, the method for the production of the first structure 10 shown in FIG. 2 will be described. The method for the production of the first structure 10 primarily comprises the following steps:

(A) arranging a coating layer comprising copper oxide and phosphorus-containing organic matter on a surface constituted by a support; and (B) selectively irradiating the coating layer with light to reduce the copper oxide to copper, to obtain the structure comprising the support and a layer in which an insulation region including the copper oxide and phosphorus and a conductive pattern region including the copper are arranged adjacent to each other on the surface constituted by the support.

In (A) described above, a coating layer including copper oxide, and hydrazine or hydrazine hydrate may be arranged on the surface constituted by the support. Alternatively, a coating layer including copper oxide, phosphorus-containing organic matter, and hydrazine or hydrazine hydrate may be arranged on the surface constituted by the support. By including hydrazine or hydrazine hydrate, the reduction with light can be further promoted, whereby a copper film having a low resistance can be obtained.

As demonstrated in (A) described above, a coating layer comprising copper oxide and phosphorus is arranged on the surface constituted by the support. Examples of this method include (a) a method in which a dispersion including copper oxide and phosphorus-containing organic matter is applied, (b) a method in which copper oxide fine particles are sprayed, and thereafter, phosphorus-containing organic matter is applied, and (c) a method in which phosphorus-containing organic matter is applied, and thereafter, copper oxide fine particles are sprayed. Though method (a) is described below as an example, the present invention is not limited thereto.

(Dispersion Preparation Method)

Next, the method for preparing the dispersion will be described. First, a copper oxide dispersion in which copper oxide fine particles are dispersed in a dispersion medium along with the phosphorus-containing organic matter.

For example, since the copper oxide fine particles synthesized in the method of (3) described above are soft aggregates, and are thus not suitable for application, it is necessary to disperse the copper oxide fine particles in a dispersion medium.

After the synthesis by the method of (3) described above has completed, separation of the synthesis solution and copper oxide fine particles is performed by a known method such as centrifugation. A dispersion medium and phosphorus-containing organic matter are added to the copper oxide fine particles and agitated by a known method such as harmonization to disperse the copper oxide fine particles in the dispersion medium.

The phosphorus-containing organic matter according to the present embodiment functions as a dispersant. However, another dispersant may be additionally added as long as the electrical insulation of the insulation region (the insulation region 12 shown in FIG. 2) is not affected thereby.

It should be noted that depending on the dispersion medium, the copper oxide fine particles may not easily disperse, whereby the dispersion may be insufficient in some cases. In such a case, an alcohol that easily disperses such as butanol is used to disperse the copper oxide, and thereafter substitution with a desired disperse medium and concentration to a desired concentration are performed. An example thereof includes a method in which concentration with a UF membrane and dilution and concentration with a desired dispersion medium are repeated.

(Application)

A thin film composed of the dispersion according to the present embodiment is formed on the surface of the support as described above. More specifically, for example, the dispersion is applied to the support and the dispersion medium is removed by drying as needed to form the coating layer. The method for forming the coating layer is not particularly limited, and an application method such as die-coating, spin-coating, slit-coating, bar-coating, knife-coating, spray-coating, and dip-coating can be used. It is desirable to apply the dispersion at a uniform thickness on the support using these methods.

It is preferable that an oxygen barrier layer be arranged so as to cover the coating layer arranged on the support. However, in the method for the production of the structure 10 shown in FIG. 2, the arrangement of an oxygen barrier layer is not necessary.

(Sintering Treatment)

As demonstrated in (B) described above, in the present embodiment, the conductive pattern region is formed by reducing the copper oxide in the coating later to generate copper particles and performing heat treatment under conditions which cause integration of the generated copper particles by the fusion thereof. This treatment is referred to as a sintering treatment.

In the present embodiment, selective irradiation is used in the sintering treatment method. In the present embodiment, for example, a flash-irradiation method in which a discharge tube such as xenon tube is used as a light source or a laser light method can be used as the light sintering method. In these methods, high-intensity light can be output for a short time, whereby the coating layer formed on the support can be raised to a high temperature for a short time to be sintered. Since the sintering time is short, damage to the support is limited, whereby such methods can be applied to a resin film substrate having low heat resistance.

The flash-irradiation method is a method in which electric charged stored in a capacitor is discharged instantly using a xenon lamp (discharge tube). According to this method, a large amount of pulsed light (xenon lamp light) is generated, irradiating the coating layer formed on the support to instantaneously heat the coating layer to a high temperature. The exposure amount can be adjusted by adjusting the light intensity, the light emission time, the irradiation interval, and the number of pulses.

In order to form the conductive pattern region, the coating layer can be selectively irradiated with a light source via a mask.

Though the emission light source is different, the same effect can be obtained using a laser light source. In the case of a laser light source, in addition to the adjustment items of the flash light system, there is a degree of freedom in wavelength selection, and the light absorption wavelength of the coating layer or the absorption wavelength of support can be selected.

Furthermore, according to the laser light method, exposure by means of beam scanning is possible, and adjustment of the exposure range is easy, whereby the coating layer can be selectively irradiated (drawn) without the use of a mask.

Examples of the types of laser light sources which can be used include YAG (yttrium, aluminum, garnet), YVO (yttrium vanadate), Yb (ytterbium), semiconductor lasers (GaAs, GaAlAs, GaInAs), carbon dioxide gas, etc. As the laser, in addition to the fundamental wave, the harmonics may be extracted and used as necessary.

In the present embodiment, the light is preferably laser light having a center wavelength in the range of 355 nm to 532 nm. By adopting such a wavelength, the coating layer including cuprous oxide absorbs the wavelength, whereby reduction of the cuprous oxide occurs uniformly and a region (conductive pattern region) having a low resistance can be obtained.

In the present embodiment, by making the support light transmissive, the light can pass the support, whereby a portion of the coating layer can be suitably sintered.

It should be noted that according to the structure in which an oxygen barrier layer is included on the surface of the coating layer, a portion of the coating layer can be suitably sintered by making one of the support or the coating layer light transmissive and allowing the light to pass through the support or the coating layer via the oxygen barrier layer.

Furthermore, in the structure in which an oxygen barrier layer is arranged on the surface of the coating layer, after the conductive pattern region has been formed, by removing the oxygen barrier layer, the structure 10 shown in FIG. 2 can be obtained.

Figure 7:
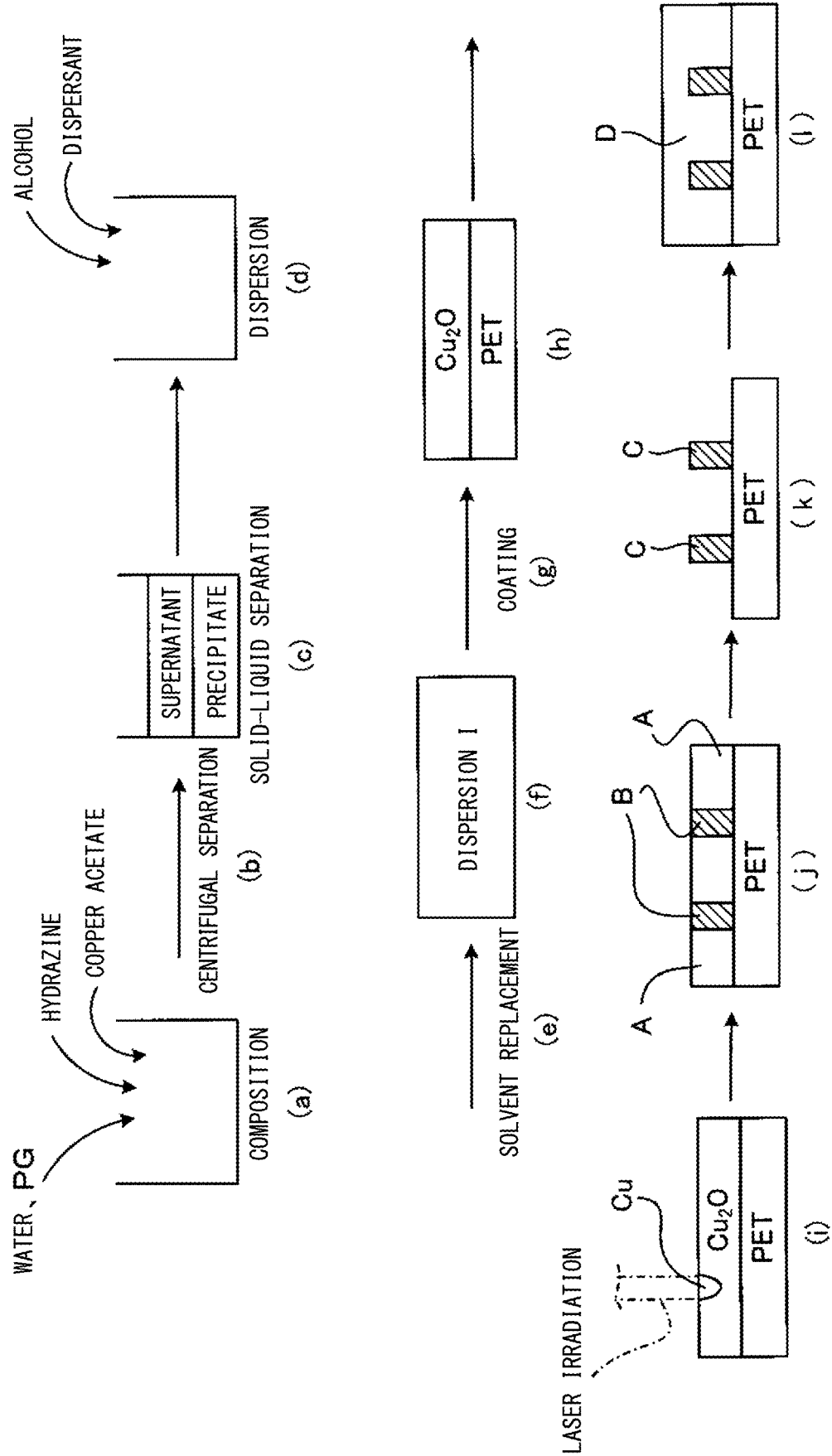
FIG. 7 is an explanatory diagram (example) of the steps representing the method for the production of the structure comprising a conductive pattern region according to the first embodiment.

The method for the production of the support including a conductive pattern region according to the first embodiment will be specifically described with reference to FIG. 7. FIG. 7 is a view detailing each of the steps of the method for the production of the support having a conductive pattern region according to the first embodiment. In FIG. 7(a), copper acetate is dissolved in a mixed solvent of water and propylene glycol (PG), and thereafter, hydrazine or hydrazine hydrate is added thereto and agitated.

Next, in FIGS. 7(b) and (c), the supernatant and precipitate are separated by centrifugation. Thereafter, in FIG. 7(d), a dispersant and an alcohol are added to the obtained precipitate and dispersed.

Next, in FIGS. 7(e) and (f), concentration by means of a UF membrane module and dilution are repeatedly performed, and thereafter the solvent is replaced to obtain a dispersion I including copper oxide fine particles.

In FIGS. 7(g) and (h), the dispersion I is applied to a PET support (denoted as "PET" in FIG. 7(h)) by spray-coating, whereby a coating layer (denoted as "$Cu_2O$" in FIG. 7(h)) including copper oxide and phosphorus-containing organic matter is formed.

Next, in FIG. 7(i), laser irradiation is performed on the coating layer to selectively sinter a portion of the coating layer, whereby the copper oxide is reduced to copper (denoted as "Cu" in FIG. 7(i)). As a result, in FIG. 7(j), a structure comprising a conductive pattern region in which is formed, on the support, a layer having an insulation region (denoted as "A" in FIG. 7(j)) including copper oxide and phosphorus and a conductive pattern region (denoted as "B" in FIG. 7(j)) including copper are arranged so as to be adjacent to each other is obtained.

In the present embodiment, removal may be performed by washing the insulation region. A state in which copper wiring (denoted as "C" in FIG. 7(k)) is patterned on the support can be obtained. It should be noted that the copper wiring C is the same layer as the conductive pattern region B. Furthermore, the area from above the copper wiring C to the support between the copper wiring C can be sealed with a second resin layer (denoted as "D" in FIG. 7(l)). Note that the second resin layer D can be formed so as to cover at least the copper wiring C as the conductive pattern region B. The second resin layer corresponds to the "another resin layer" described above.

When the insulation region is removed, water, an alcohol such as ethanol, propanol, butanol, isopropyl alcohol, methanol, ethylene glycol, or glycerin, or an organic solvent such as a ketone, ester, or ether can be used. In particular, in terms of cleaning performance of the insulation region, water, ethanol, propanol, butanol, and isopropyl alcohol are preferable. Furthermore, a phosphorus-based dispersant may be added to the above solvents. The addition of a dispersant further improves cleaning performance.

When the structure 10 shown in FIG. 2 is produced, the structure 10 can be obtained without the use of the stack 40 shown in FIG. 5 and without an oxygen barrier layer, which is an example of a resin layer (FIG. 7h), as long as, for example, a vacuum atmosphere or the like is used. Naturally, by using a stack comprising an oxygen barrier layer, equipment for creating a vacuum atmosphere or inert gas atmosphere is necessary, whereby merits such as a reduction in the production costs of the structure comprising a conductive pattern region can be obtained.

Next, in the second methods for the production of the structures 20, 30, and 50 shown in the explanatory FIGS. 3, 4, and 6, it is preferable that the stack 40 shown in FIG. 5 be used.

Specifically, the second method for the production of a structure comprising a conductive pattern region comprises the following steps.

(C) arranging a coating layer including copper oxide and phosphorus-containing organic matter on the surface constituted by the support, and (D) arranging a resin layer (first resin layer) so as to cover the coating layer, and (E) selectively irradiating the coating layer with light via either the resin layer or the support to reduce the copper oxide to copper, whereby a structure comprising a conductive pattern region including the support, a layer in which an insulation region including copper oxide and phosphorus-containing organic matter and a conductive pattern region including copper are arranged on the surface constituted by the support so as to be adjacent to each other, and a resin layer formed so as to cover the layer is obtained.

In (C) described above, a coating layer including copper oxide, and hydrazine or hydrazine hydrate may be arranged on the surface constituted by the support. Alternatively, a coating layer including copper oxide, phosphorus-containing organic matter, and hydrazine or hydrazine hydrate may be arranged on the surface constituted by the support. By including hydrazine or hydrazine hydrate, reduction by irradiation can be better promoted, whereby a copper film having a low resistance can be obtained.

Step (C) herein is identical to step (A) described above. In step (D), the resin layer is formed on the surface of the coating layer. By performing steps (C) and (D), the stack 40, as an intermediate, shown in FIG. 5 can be produced.

In other words, the method for the production of the stack 40 comprises a step in which a coating layer comprising copper oxide and phosphorus-containing organic matter is arranged on the surface constituted by the support, and a step in which the resin layer (oxygen barrier layer 45) is arranged so as to cover the coating later. Alternatively, the method for the production of the stack 40 comprises a step in which a coating layer comprising copper oxide, and hydrazine or hydrazine hydrate is arranged on the surface constituted by the support, and a step in which the resin layer (oxygen barrier layer 45) is arranged so as to cover the coating layer. As an alternative, the method for the production of the stack 40 comprises a step in which a coating layer comprising copper oxide, phosphorus-containing organic matter, and hydrazine or hydrazine hydrate is arranged on the surface constituted by the support, and a step in which the resin layer (oxygen barrier layer 45) is arranged so as to cover the coating layer.

In the stack 40 shown in FIG. 5, the oxygen barrier layer 45 is attached to the coating layer 44 via an adhesive layer 46. However, the adhesive layer 46 is not necessary. For example, the adhesive layer 46 is not necessarily required, for example, in the case in which the oxygen barrier layer 45 is formed by a cured resin or the case in which a thermoplastic resin is heated and press-laminated. For example, the material constituting the oxygen barrier layer can be formed by pressing and laminating the coating layer while heating to soften and applying pressure thereto.

In the description above, the oxygen barrier layer 45 is merely an example of the resin layer. A resin film comprising an oxygen barrier layer as the resin layer and an adhesive layer is a preferable form. As a result, the resin film is attached to the surface of the coating layer 44, whereby the stack 40 shown in FIG. 5 can be easily and suitably produced.

It should be noted that the adhesive is not particularly limited, and an acrylate resin, an epoxy resin, or a silicone resin can be used.

Furthermore, the adhesive strength of the adhesive layer is preferably in the range of 5 mN/10 mm to 10 N/10 mm. As a result, the oxygen barrier layer can be suitably secured to the coating layer via the adhesive layer, and the oxygen barrier layer can be easily peeled off in subsequent processes. Further, by setting the adhesive strength to within the range of 1 N/10 mm to 10 N/10 mm, the oxygen barrier layer can be firmly secured to the coating layer via the adhesive layer.

The above sintering treatment is applied to the stack formed in steps (C) and (D) described above, whereby the conductive pattern region is formed.

In the present embodiment, either the oxygen barrier layer or the support is light transmissive. As a result, during irradiation, the light can pass through the oxygen barrier layer or support, whereby a portion of the coating layer can be sintered.

As described above, the structure 20 shown in FIG. 3 or the structure 50 comprising a conductive pattern region shown in FIG. 6 can be produced.

(Arrangement of Other Resin Layer)

Next, the oxygen barrier layer may be replaced with another resin layer if necessary. First, the oxygen barrier layer and dissolved with a solvent and removed. At this time, in the case in which the adhesive layer described above is used, only the adhesive layer may be dissolved by the solvent and removed. Furthermore, by using an adhesive having a low predetermined adhesive strength, the oxygen barrier layer can be peeled away from the layer comprising a conductive pattern region, whereby the oxygen barrier layer can be peeled off without the use of a solvent.

Thereafter, the sealing material layer, which is an example of another resin layer, is arranged so as to cover the exposed layer comprising a conductive pattern region. The sealing material layer can be formed by attaching a resin sheet composed of the material constituting the sealing material layer described above to the coating layer with a separately prepared adhesive.

Furthermore, the sealing material layer may be formed by pressing and laminating the coating layer while heating, so as to soften, the material constituting the sealing material layer described above and applying pressure thereto. Further, a curable material which is photocured or thermally cured is selected, and a coating layer composed of the curable material is formed on the exposed layer comprising a conductive pattern region and thereafter cured with light or heat.

Figure 8:
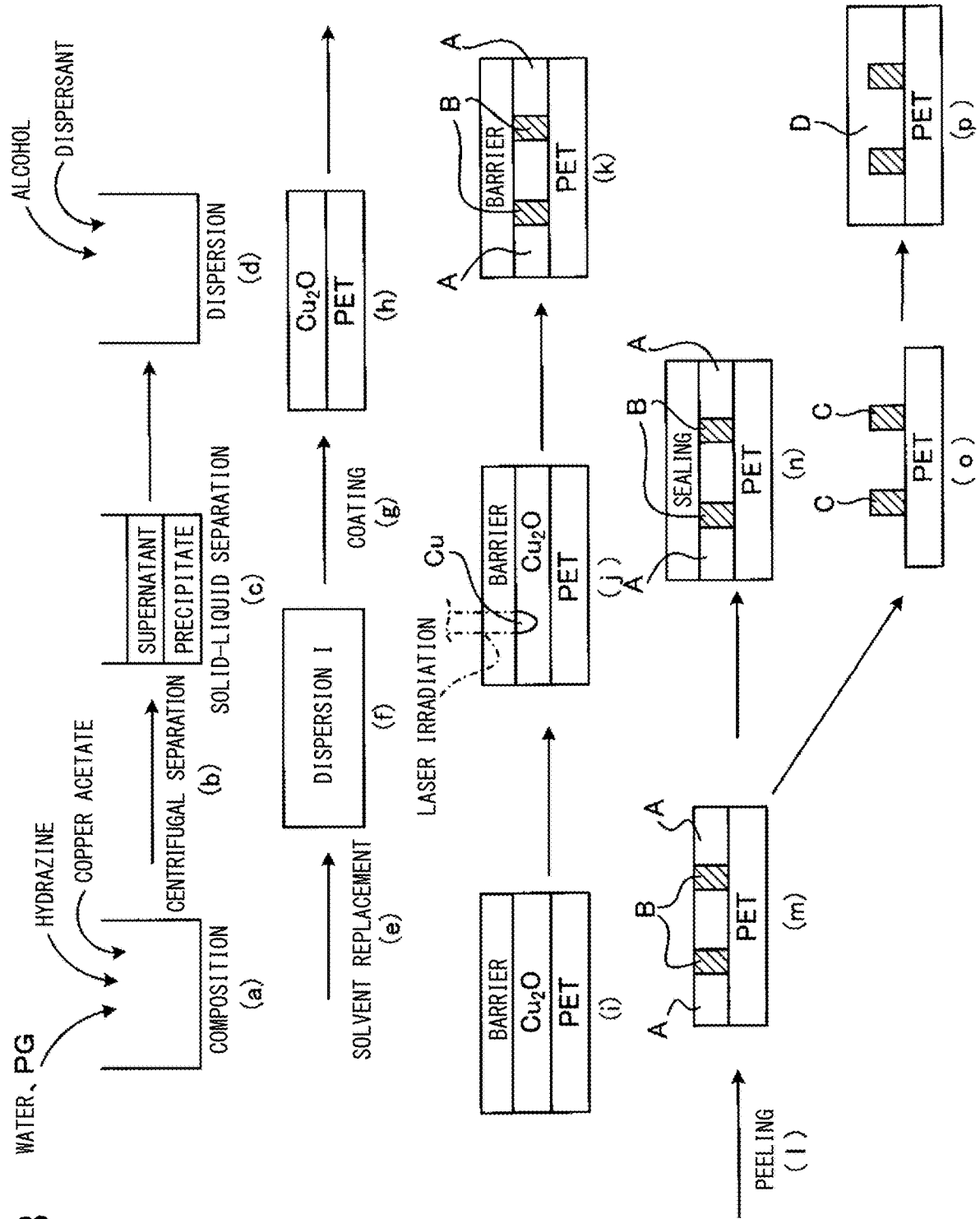
FIG. 8 is an explanatory diagram (example) of the steps representing the method for the production of the structure comprising a conductive pattern region according to the second embodiment.

The method for the production of a support including a conductive pattern region according to the second embodiment will be more specifically described with reference to FIG. 8. FIG. 8 is an explanatory diagram illustrating the steps of the method for the production of the support including a conductive pattern region according to the present embodiment. In FIG. 8(a), copper acetate is dissolved in a mixed solvent of water and propylene glycol (PG), and thereafter, hydrazine or hydrazine hydrate is added thereto and agitated.

Next, in FIGS. 8(b) and (c), the supernatant and the precipitate are separated by centrifugation. Next, in FIG. 8(d), a dispersant and an alcohol are added to the obtained precipitate and dispersed.

Thereafter, in FIGS. 8(e) and (f), concentration with a UF membrane module and dilution are repeated, and the solvent is removed to obtain a dispersion I including copper oxide fine particles.

In FIGS. 8(g) and (h), dispersion I is applied to a PET support (denoted as "PET" in FIG. 8(h)) by spray-coating, whereby a coating layer (denoted as "$Cu_2O$" in FIG. 8(h)) including copper oxide and phosphorus-containing organic matter is formed.

Next, in FIG. 8(i), an oxygen barrier layer (denoted as "barrier" in FIG. 8(i)) is arranged on the coating layer.

Next, in FIG. 8(j), laser irradiation of the coating layer is performed via the oxygen barrier layer and a portion of the coating layer is selectively sintered to reduce the copper oxide to copper (denoted as "Cu" in FIG. 8(j)). As a result, in FIG. 8(k), a layer in which an insulation region (denoted as "A" in FIG. 8(k)) including copper oxide and phosphorus-containing organic matter and a conductive pattern region (denoted as "B" in FIG. 8(k)) including copper are arranged on the support so as to be adjacent to each other is obtained.

Next, in FIGS. 8(l) and (m), the oxygen barrier layer is removed with a solvent, whereby the layer in which the conductive pattern region and the insulation region are adjacent is exposed. Thereafter, in FIG. 8(n), the surface of the layer in which the conductive pattern region and the insulation region are adjacent is covered with a sealing material layer (denoted as "sealing" in FIG. 8(n)), whereby the structure comprising a conductive pattern region shown in FIG. 8 can be obtained.

In the present embodiment, removal may be performed by washing the insulation region. A state in which copper wiring (denoted as "C" in FIG. 8(o)) is patterned on the support can be obtained. It should be noted that the copper wiring C is the same layer as the conductive pattern region B. Furthermore, the area from above the copper wiring C to the support between the copper wiring C can be sealed with a second resin layer (denoted as "D" in FIG. 8(p)). Note that the second resin layer D can be formed so as to cover at least the copper wiring C as the conductive pattern region B. The second resin layer corresponds to the "another resin layer" described above.

When the insulation region is removed, water, an alcohol such as ethanol, propanol, butanol, isopropyl alcohol, methanol, ethylene glycol, or glycerin, or an organic solvent such as a ketone, ester, or ether can be used. In particular, in terms of cleaning performance of the insulation region, water, ethanol, propanol, butanol, and isopropyl alcohol are preferable. Furthermore, a phosphorus-based dispersant may be added to the above solvents. The addition of a dispersant further improves cleaning performance.

It should be noted that the oxygen barrier layer can function as the sealing material layer by omitting the removal thereof. At this time, the structure comprising a conductive pattern region shown in FIGS. 3 and 6 can be produced. Thus, the step for removing the oxygen barrier layer and the subsequent steps are not necessary in the method for the production of a structure comprising a conductive pattern region according to the present embodiment.

In the method for the production of the structure according to the present embodiment, after the layer comprising the conductive pattern region and the insulation region is obtained by light irradiation, the insulation region can be removed from the layer in which the conductive pattern region and insulation region are adjacent, as shown in FIGS. 7(k) and 8(o). For example, the insulation region can be selectively washed and removed by using an etching solution which dissolves the insulation region without dissolving the conductive pattern region. In the present embodiment, the boundary between the conductive pattern region and the insulation region can be clearly distinguished, whereby the selective removal of only the insulation region described above can be suitably performed.

Furthermore, in the present embodiment, after the insulation region as been removed from the layer, as described above, a second resin layer may be arranged so as to cover the surface of the conductive pattern, as shown in FIGS. 7(l) and 8(p). As a result, insulation of the conductive pattern regions and the areas therebetween can be ensured. Furthermore, an effect as a barrier film on the durability of copper wiring can be achieved. The "other resin layers" described above can be used as the second resin layer.

In the present embodiment, the copper wire can remain on the support by, for example, removing the insulation region. the conductive pattern region, which comprises reduce copper obtained by reducing copper oxide, phosphorus, and carbon, remaining on the support can be produced as the copper wiring according to the present embodiment. Alternatively, even if the insulation region is not removed, among the conductive pattern region and the insulation region, the conductive pattern region can be considered as the copper wiring. At this time, in the present embodiment, the phosphorus/copper elemental concentration ratio in the copper wiring is in 0.02 to 0.30, the carbon/copper elemental concentration ratio is 1.0 to 6.0, and Ra can preferably be 20 nm to 500 nm. A phosphorus/copper elemental concentration ratio of 0.02 to 0.30 can be produced by, for example, providing a coating layer including copper oxide and phosphorus-containing organic matter, and irradiating with light to obtained reduced copper from the copper oxide. The phosphorus/copper elemental concentration ratio can be adjusted by adjusting the ratio of copper oxide and phosphorus-containing organic matter. A carbon/copper ratio of 1.0 to 6.0 can be produced by, for example, providing a coating layer including copper oxide and organic matter, and irradiating with light to obtain reduced copper from the copper oxide. The carbon/copper elemental concentration ratio can be adjusted by adjusting the ratio of copper oxide and organic matter. Furthermore, an Ra of the surface of the copper wiring of 20 nm to 500 nm can be produced by, for example, adjusting the irradiation intensity, irradiation rate, and irradiation period of the light during irradiation, whereby the desired Ra can be obtained.

Furthermore, in the structure comprising a conductive pattern region or the method for the production of a stack according to the present embodiment, the light transmittance at a wavelength of 445 nm of the resin layer or the support is preferably 30% or more, more preferably 40% or more, and further preferably 50% or more. The upper limit of the light transmittance may be 98% or less. In addition to 445 nm, the wavelength can be selected from wavelengths from near ultraviolet to near infrared such as 355 nm, 405 nm, 450 nm, 532 nm, and 1064 nm. By increasing the light transmittance as such a wavelength, the coating layer can be sintered by irradiating from the support side, whereby the conductive pattern region can be formed.

In the structure comprising a conductive pattern region or the method for the production of a stack according to the present embodiment, the copper oxide contained in the coating layer is preferably cuprous oxide. As a result, reduced copper can be obtained by the sintering treatment, whereby a layer in which the conductive pattern region and the insulation region are mixed can be more accurately formed.

In the structure comprising a conductive pattern region or method for the production of a stack according to the present embodiment, the phosphorus-containing organic matter contained in the coating layer preferably has a skeleton represented by chemical formula (1) below (where R is an ester salt).

[Chem. 5]

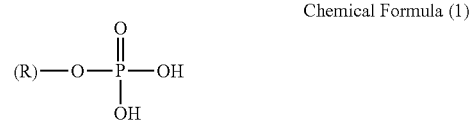

Chemical Formula (1)

In chemical formula (1), R is an ester salt.

The structure of the chemical formula (1) above adsorbs copper oxide and has excellent adhesion to the support. As a result, the insulation properties thereof can be ensured, and peeling between the support and the coating layer can be effectively prevented.

In the structure comprising a conductive pattern region or the method for the production of a stack according to the present embodiment, the support can be a three-dimensional object. Specifically, the present embodiment is not limited to only flat supports, and curved or stepped supports may be used. For example, the structure comprising a conductive pattern region according to the present embodiment can be formed using the surface of a housing or chassis as the support surface.

Application Examples

The structure comprising a conductive pattern region according to the present embodiment can be suitably used as, for example, a wiring material such as an electronic circuit board (a printed board, RFID, substitutes for the wiring harnesses of an automobiles, etc.), or the antenna, mesh electrode (electrode film for capacitive touch panels), electromagnetic shielding material, or heat dissipation material formed on the housing of a portable information device (smartphone, etc.).

As described above, according to the structure comprising a conductive pattern region according to the present embodiment, insulation within the conductive pattern region including copper can be provided by the insulation region comprising copper oxide and phosphorus. Thus, during production, it is not necessary to remove unsintered portions of the layer arranged on the support, and as a result, the production steps can be reduced, and since a solvent or the like is not necessary, production costs can be reduced. Furthermore, an insulation region for insulating the conductive pattern region is used, whereby the insulation region can reduce the occurrence of cracking and increase reliability.

According to the method for the production of the structure comprising a conductive pattern region according to the present embodiment, the conductive pattern region is formed by sintering a portion of the coating layer comprising copper oxide and phosphorus-containing organic matter with a laser, and the unsintered portions can be used to insulate the conductive pattern region. Thus, it is not necessary to remove the unsintered portions of the coating layer. Therefore, the production processes can be reduced, and since a solvent or the like is not necessary, production costs can be reduced. Since it is not necessary to provide solder resist for insulating the conductive pattern region, whereby the production processes can be reduced in this regard.

According to the stack according to the present embodiment, by covering the coating layer with a resin layer, contact of the coating layer with oxygen can be prevented during light sintering, whereby the reduction of copper oxide can be promoted. As a result, it is not necessary to provide equipment for producing a vacuum or low-oxygen atmosphere around the coating layer during irradiation, whereby production costs can be reduced. Furthermore, since the coating layer is covered with the resin layer, the coating layer can be protected from external stresses, whereby the handling properties thereof are improved.

According to the method for the production of a stack according to the present embodiment, the stack can be easily and suitably produced using a step in which a coating layer including copper oxide and phosphorus-containing organic matter is formed on the surface of the support, and a step in which the resin layer is formed on the surface of the coating layer.

Examples

The present invention will be described in greater detail below by way of the specific Examples.

<Dispersion Production>

80 g of copper(II) acetate monohydrate (manufactured by Wako Pure Chemical Industries) was dissolved in a mixed solvent composed of 800 g of water and 400 g of 1,2-propylene glycol (manufactured by Wako Pure Chemical Industries), 20 g of hydrazine or hydrazine hydrate (manufactured by Wako Pure Chemical Industries) was then added thereto and agitated, and thereafter, the supernatant and precipitate were separated by centrifugation.

0.05 g of DISPERBYK-145 (product name, manufactured by BYK Chemie; denoted as BYK-145 in Table 1) as the phosphorus-containing organic matter and 6.6 g of ethanol (manufactured by Wako Pure Chemical Industries) as the dispersion medium were added to 2.8 g of the obtained precipitate and dispersed using a harmonizer. dilution using additional ethanol and concentration were repeatedly performed, and as a result, a dispersion (a) comprising cuprous oxide fine particles including cuprous oxide (copper(I) oxide) was obtained. By vacuum drying the precipitate, the weight of cuprous oxide fine particles in the precipitate was measured. The content of cuprous oxide fine particles in 2.8 g of precipitate was 2.0 g.

It should be noted that the cuprous oxide fine particles obtained by vacuum drying were observed with a transmission electron microscope and analyzed by energy dispersion X-ray spectroscopy, and the content (% by volume) of cuprous oxide in the cuprous oxide fine particles was 100% by volume (refer to Table 1).

Dispersions (b) through (g) including cuprous oxide fine particles were obtained by the same method as descried above except that the amounts of phosphorus-containing organic matter added to the 2.8 g of precipitate was changed as described in Table 1. The contents (% by volume) of copper oxide in the entirety of the fine particles contained in dispersions (b) through (g) were measured and were 100% by volume (refer to Table 1).

TABLE 1

| | Composition (g) | | | | | |
|---|---|---|---|---|---|---|
| Dispersion | Precipitate | Copper Powder | Organic Matter BYK-145 | Solvent Ethanol | Reducing Agent Hydrazine Hydrate | Content of Copper Oxide in Fine Particles (% by Volume) |
| a | 2.8 | 0 | 0.05 | 6.6 | 0 | 100 |
| b | 2.8 | 0 | 0.15 | 6.6 | 0 | 100 |
| c | 2.8 | 0 | 0.4 | 6.6 | 0 | 100 |
| d | 2.8 | 0 | 0.8 | 6.6 | 0 | 100 |
| e | 2.8 | 0 | 1.6 | 6.6 | 0 | 100 |
| f | 2.8 | 0 | 3.2 | 6.6 | 0 | 100 |
| g | 2.8 | 0 | 4.8 | 6.6 | 0 | 100 |
| h | 2.8 | 2 | 0.4 | 6.6 | 0 | 59.7 |
| i | 2.8 | 4 | 0.4 | 6.6 | 0 | 42.6 |
| j | 2.8 | 0 | 2 | 6.6 | 0 | 100 |
| k | 2.8 | 0 | 0.4 | 6.6 | 0.01 | 100 |
| l | 2.8 | 0 | 0.4 | 6.6 | 0.1 | 100 |

Furthermore, dispersions (h) and (i) were obtained by adding copper powder (average particle size 1 μm, spherical particles) to dispersion (c) in the quantities shown in Table 1. The contents (% by volume) of copper oxide in the entirety of the fine particles (copper oxide fine particles and copper powder) contained in dispersions (h) and (i) were measured and were 59.7% by volume and 42.6% by volume, respectively (refer to Table 1).

<Production of Samples>

[Samples 1 to 19]

Samples in which a coating layer is formed on a support were obtained by subjecting the surface of the support to a UV-ozone treatment, applying a dispersion at a desired thickness by bar-coating, and drying for 10 minutes at room temperature.

Samples 1 to 19 were obtained by changing the type of the support, the type of the dispersion, and the thickness of the coating layer as shown in Table 2.

A PET film having a thickness of 100 μm (manufactured by Toyobo Co., Ltd.; Cosmoshine A4100) was used as the support PET.

[Sample 20]

A UV-ozone treatment was applied to the surface of a PET film (Toyobo Co., Ltd.; Cosmoshine A4100) having a thickness of 100 μm as the support, and thereafter, an adhesion layer was formed by roughening the surface thereof by means of reactive ion etching (RIE) with oxygen gas.

Next, sample 20 was obtained by applying dispersion (c) to the adhesion layer at a desired thickness of 0.5 μm by bar-coating, and thereafter drying for 10 minutes at room temperature.

[Samples 21 to 23]

Samples 21 to 23 were obtained in the same manner as Sample 20 above except that the types of the support were changed as shown in Table 2. The specific surface areas and surface roughnesses of the obtained adhesion layers were measured and are shown in Table 2.

The PEN film, PI film, and m-PPE sheet described below were used as the supports.

PEN film (manufactured by Teijin Film Solutions Co., Ltd.; Teonex Q65H; thickness 100 μm)

PI film (manufactured by DuPont-Toray Co., Ltd; Kapton 500H; thickness 125 μm) m-PPE sheet (manufactured by Asahi Kasei; E1000; thickness 125 μm)

[Sample 24]

A UV-ozone treatment was applied to the surface of a PET film (manufactured by Toyobo Co., Ltd.; Cosmoshine A4100) having a thickness of 100 μm as the support, and thereafter a coating solution containing silicon oxide fine particles (average particle size 25 nm) was applied thereto. Drying was then performed at room temperature for 30 minutes to form an adhesion layer having a thickness of 5 μm.

Thereafter, Sample 24 was obtained in the same manner as Samples 1 to 19 above except that dispersion (a) was change to dispersion (c).

[Sample 25]

A UV-ozone treatment was applied to the surface of a PET film (manufactured by Toyobo Co., Ltd.; Cosmoshine A4100) having a thickness of 100 μm as the support, and thereafter a coating solution containing aluminum oxide fine particles (average particle size 110 nm) was applied thereto by blade-coating. Drying was then performed at room temperature for 30 minutes to form an adhesion layer having a thickness of 10 μm.

Thereafter, Sample 25 was obtained in the same manner as Samples 1 to 19 above except that dispersion (a) was changed to dispersion (c).

<Evaluation and Measurement Methods>

(Dispersion Film-Forming Property Evaluation)

Figure 9:
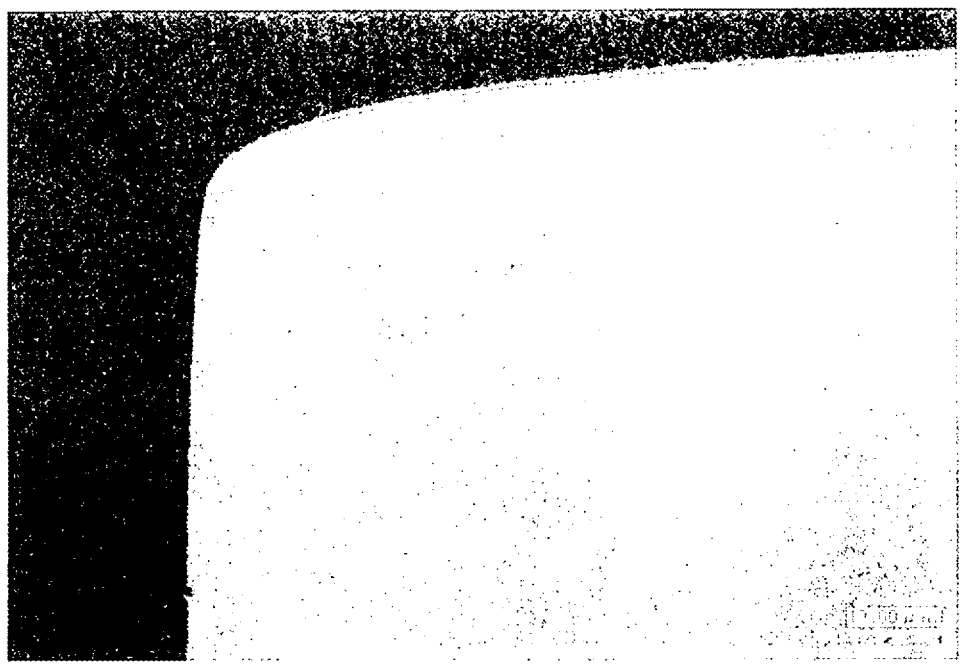
FIG. 9 is an electron micrograph detailing the state of cracking of a coating layer in an Example.
Figure 10:
FIG. 10 is an electron micrograph detailing the state of cracking of a coating layer in an Example.

The film-forming properties of the coating layers of the obtained samples were observed with a shape-measuring laser microscope (manufactured by Keyence Corp.; VK-9510). At this time, an objective lens having a magnification of a factor of 10 was used. The evaluation criteria are as described below. FIGS. 9 and 10 are electron micrographs detailing the state of cracking of the coating layers of the Examples. FIG. 9 shows an example of a coating layer in which cracking did not occur, and FIG. 10 shows an example of a coating layer in which cracking did occur.

(Laser Sintering and Conductivity Evaluation)

A conductive pattern region including copper having desired dimensions of 25 mm×1 mm was obtained by irradiating the substrate of a sample with laser light (wavelength 445 nm; output 1.2 W; continuous wave (CW)) in an argon gas atmosphere while moving the focal point at a maximum speed of 300 mm/min using a Galvano scanner.

The method for evaluating conductivity is described below. Testers were attached to both ends of the conductive pattern region to evaluate conductivity. The evaluation criteria are as described below.

Excellent: resistance value is less than 1 kΩ

Good: resistance value is in the range of 1 kΩ to less than 1 MΩ

Poor: resistance value is 1 MΩ or greater (Xenon-Flash Sintering and Conductivity Evaluation)

A 30 mm square sample was arranged on a stage in an argon gas atmosphere. A light-shielding mask provided with an aperture having a size of 25 mm×1 mm was placed thereon, and the sample was further irradiated with a xenon flash (irradiation energy 3 J/cm$^2$; irradiation time 4 msec) from above. As a result, a conductive pattern region including copper having dimensions of 25 mm×1 mm was obtained. The portions of the sample outside of the aperture of the light mask were unchanged from the state prior to xenon flash irradiation.

Testers were attached to both ends of the conductive pattern region to evaluate conductivity. The evaluation criteria are as described below.

Excellent: resistance value is less than 1 kΩ

Good: resistance value is in the range of 1 kΩ to less than 1 MΩ

Poor: resistance value is 1 MΩ or greater

Conductivity can be exhibited by the conductive pattern region by either laser sintering or xenon-flash sintering, and can be used as the support having a conductive pattern region.

(Measurement of Insulation Resistance)

Two needle-like probes were arranged on the insulation region including cuprous oxide and phosphorus-containing organic matter, which is the unsintered portions of the samples after sintering, at 5 mm intervals. Using an insulation resistance tester TOS7200 manufactured by Kikusui Electronics Corp., a voltage of 500 V was applied across the two needle-like probes, and the resistance value at that time was evaluated. The evaluation criteria are as described below.

Excellent: 5000 MΩ or greater

Good: 1 MΩ to less than 5000 MΩ

Poor: less than 1 MΩ

(Average Particle Size)

The average primary particle size of the cuprous oxide fine particles could be measured with a transmission electron microscope or a scanning electron microscope. The specific operation will be described. A sample was cut to a suitable size, and subjected to broad ion beam (BIB) machining using an ion milling device E-3500 manufactured by Hitachi Technologies. At this time, BIB machining was performed while cooling the sample as needed. A conductive treatment was applied to the machined sample, and a cross-section of a conductive adhesion portion was observed using a scanning electron microscope S-4800 manufactured by Hitachi, Co., Ltd. All of the primary particle sizes in an image in which 10 or more primary particles were present in one visual field were measured, and the average value thereof was taken as the average primary particle size.

The average secondary particle size of the cuprous oxide fine particles could be measured with a transmission electron microscope or a scanning electron microscope. The specific operation will be described. A sample was cut to a suitable size, and subjected to BIB machining using an ion milling device E-3500 manufactured by Hitachi Technologies. At this time, BIB machining was performed while cooling the sample as needed. A conductive treatment was applied to the machined sample, and a cross-section of a conductive adhesion portion was observed using a scanning electron microscope S-4800 manufactured by Hitachi, Co., Ltd. All of the secondary particle sizes in an image in which 10 or more secondary particles were present in one visual field were measured, and the average value thereof was taken as the average secondary particle size.

(Deflection Temperature Under Load)

The deflection temperature under load of the support was measured in accordance with the method prescribed in JIS K7191.

(Measurement of Ratio (Vol %) of Cuprous Oxide Fine Particles, Copper Powder, and Phosphorus-Containing Organic Matter)

The ratio (vol %) of the cuprous oxide fine particles, copper powder, when included, and phosphorus-containing organic matter in the insulation region in the layer was measured by observing a cross-section of the layer arranged on the support with a scanning electron microscope (SEM).

Figure 11:
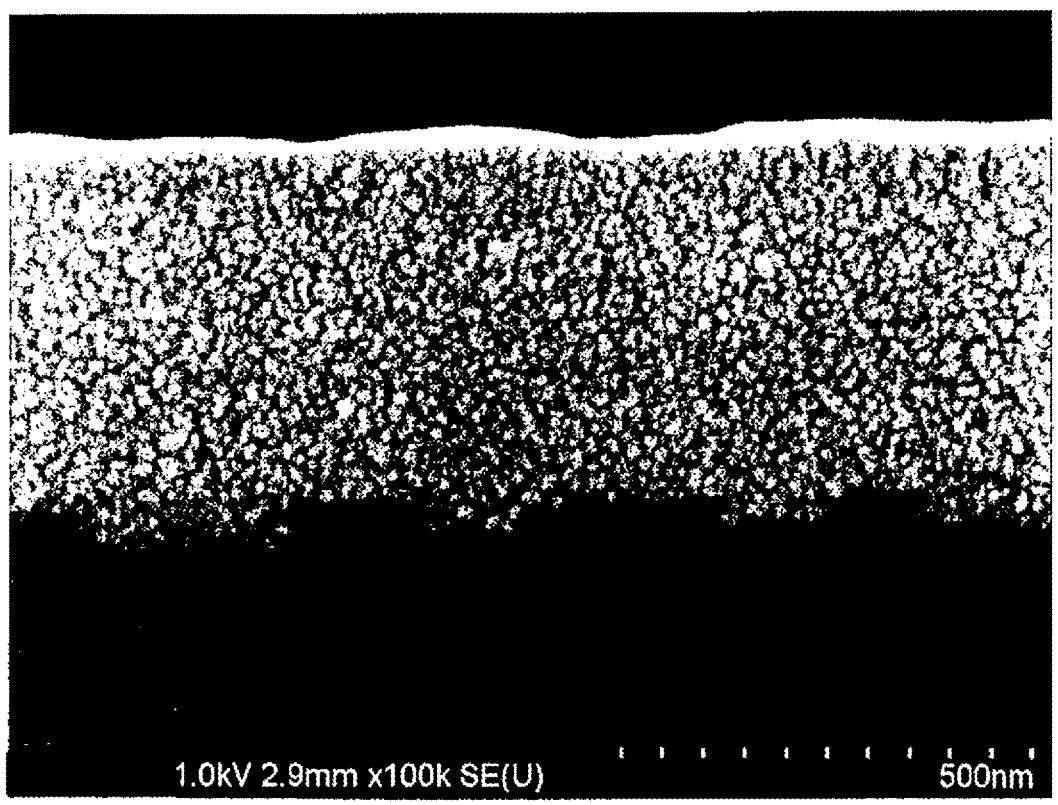
FIG. 11 is an electron micrograph showing a cross-section of layers formed on a support in an Example.

FIG. 11 is an electron micrograph showing a cross-section of the layer arranged on the support according to an Example. As shown in FIG. 11, since a material having a high electron density could be fairly brightly observed, the inorganic matter could be more brightly observed than the organic matter, and the conductive metal could be more brightly observed than the oxide. Thus, in the observation region of the layer in the electron micrograph, the cuprous oxide fine particles and copper powder (hereinafter referred to as "all particles") and the phosphorus-containing organic matter could be distinguished in terms of shape, size, and contrast. The ratio (vol %) of all particles could be determined by multiplying the quotient of the area occupied by all particles in the image (hereinafter referred to as a "cross-sectional image") of a cross-section of the layer including the observation region and the total area of the layer in the cross-sectional image by 100.

Furthermore, the cuprous oxide fine particles and the copper powder could likewise be distinguished in terms of shape, size, and contrast. Thus, the ratio (vol %) of copper oxide in all of the particles could be determined by multiplying the quotient of the area occupied by the cuprous oxide fine particles in the cross-sectional image and the area occupied by all particles in the cross-sectional image by 100. Furthermore, the ratio (vol %) of copper powder in all of the particles could be determined by multiplying the quotient of the area occupied by the copper powder in the cross-sectional image and the area occupied by all particles in the cross-sectional image by 100.

Furthermore, the ratio (vol %) of phosphorus-containing organic matter could be determined by multiplying the quotient of the area occupied by the phosphorus-containing organic matter in the cross-sectional image and the total area of the layer in the cross-sectional image by 100.

The images can be analyzed using image processing software, and an example thereof includes ImageJ (produced by the American National Institute of Health). In the examples, a cross-sectional image was fed into ImageJ, converted into a black and white 8-bit image, a default threshold value was set, and particle analysis was performed to obtain the contents of cuprous oxide fine particles and copper powder.

(Measurement of Ratio (Vol %) of Cuprous Oxide Fine Particles, Copper Powder, and Phosphorus-Containing Organic Matter)

The ratios (% by weight) can be calculated from the ratios (vol %) determined from the cross-sectional image and the specific gravities of the copper oxide, copper, and phosphorus-containing organic matter. The following values can be used as the specific gravities of the copper oxide, copper, and phosphorus-containing organic matter.

copper oxide: 6.0 $g/cm^3$ copper: 8.9 $g/cm^3$ phosphorus-containing organic matter: 1.0 $g/cm^3$ Regarding the specific gravities of materials other than those described above, the numerical values described in a chemical handbook, a scientific table, etc., may be used.

The parts by volume of the phosphorus-containing organic matter when the total volume of the cuprous oxide fine particles or the cuprous oxide fine particles and the copper powder, when included, in the insulation region of the layer is taken as 100 parts by volume was calculated based on the ratio (vol %) of the cuprous oxide fine particles, copper powder, and phosphorus-containing organic matter in the insulation region of the layer determined in this manner, and are shown in Table 2. Likewise, the parts by mass of the phosphorus-containing organic matter when the total mass of the cuprous oxide fine particles or the cuprous oxide fine particles and the copper powder, when included, in the insulation region of the layer is taken as 100 parts by mass was calculated and is shown in Table 2.

(Support Adhesion)

The adhesion of the conductive pattern region, which was obtained by sintering, with the support was visually evaluated in accordance with the following evaluation criteria.

Excellent: the conductive pattern region adhered with the support

Good: though partial peeling was observed, as a whole, adhesion with the support was achieved Poor: the conductive pattern region peeled away from the support.

TABLE 2

| Sample | Support | Type | Dispersion Average Primary Particle Size | Dispersion Average Secondary Particle Size | Thickness μm | Single Layer Phosphorus-Containing Organic Matter Parts by Volume | Single Layer Phosphorus-Containing Organic Matter Parts by Weight | Film-Forming Property | Laser Sintering Conductivity | Laser Sintering Substrate Adhesion | Xenon-Flash Sintering Conductivity | Xenon-Flash Sintering Substrate Adhesion | Insulation Resistance |
|---|---|---|---|---|---|---|---|---|---|---|---|---|---|
| Sample 1 | PET | b | 7.8 | 21.1 | 0.5 | 45 | 7.5 | Excellent | Good | Good | Poor | Poor | Good |
| Sample 2 | PET | c | 7.9 | 21.3 | 0.5 | 120 | 20 | Excellent | Excellent | Excellent | Poor | Poor | Excellent |
| Sample 3 | PET | d | 7.7 | 21.6 | 0.5 | 240 | 40 | Excellent | Excellent | Excellent | Poor | Poor | Excellent |
| Sample 4 | PET | e | 8.0 | 21.5 | 0.5 | 480 | 80 | Excellent | Excellent | Excellent | Poor | Poor | Excellent |
| Sample 5 | PET | f | 7.8 | 21.6 | 0.5 | 960 | 160 | Excellent | Good | Excellent | Poor | Poor | Excellent |
| Sample 6 | PET | g | 7.9 | 21.4 | 0.5 | 1440 | 240 | Excellent | Good | Excellent | Poor | Poor | Excellent |
| Sample 7 | PEN | c | 7.9 | 21.3 | 0.5 | 120 | 20 | Excellent | Excellent | Excellent | Poor | Poor | Excellent |
| Sample 8 | PI | c | 7.9 | 21.3 | 0.5 | 120 | 20 | Excellent | Excellent | Excellent | Excellent | Excellent | Excellent |
| Sample 9 | PP | c | 7.9 | 21.3 | 0.5 | 120 | 20 | Excellent | Excellent | Excellent | Poor | Poor | Excellent |
| Sample 10 | PA | c | 7.9 | 21.3 | 0.5 | 120 | 20 | Excellent | Excellent | Excellent | Poor | Poor | Excellent |
| Sample 11 | ABS | c | 7.9 | 21.3 | 0.5 | 120 | 20 | Excellent | Excellent | Excellent | Poor | Poor | Excellent |
| Sample 12 | PE | c | 7.9 | 21.3 | 0.5 | 120 | 20 | Excellent | Excellent | Excellent | Poor | Poor | Excellent |
| Sample 13 | PC | c | 7.9 | 21.3 | 0.5 | 120 | 20 | Excellent | Excellent | Excellent | Poor | Poor | Excellent |
| Sample 14 | POM | c | 7.9 | 21.3 | 0.5 | 120 | 20 | Excellent | Excellent | Excellent | Poor | Poor | Excellent |
| Sample 15 | PBT | c | 7.9 | 21.3 | 0.5 | 120 | 20 | Excellent | Excellent | Excellent | Poor | Poor | Excellent |
| Sample 16 | m-PPE | c | 7.9 | 21.3 | 0.5 | 120 | 20 | Excellent | Excellent | Excellent | Poor | Poor | Excellent |
| Sample 17 | PPS | c | 7.9 | 21.3 | 0.5 | 120 | 20 | Excellent | Excellent | Excellent | Poor | Poor | Excellent |
| Sample 18 | PET | h | — | — | 2 | 120 | 20 | Excellent | Excellent | Good | Poor | Poor | Good |
| Sample 19 | PET | i | — | — | 2 | 120 | 20 | Excellent | Excellent | Good | Poor | Poor | Good |
| Sample 20 | PET | c | 7.9 | 21.3 | 0.5 | 120 | 20 | Excellent | Excellent | Excellent | Excellent | Excellent | Excellent |
| Sample 21 | PEN | c | 7.9 | 21.3 | 0.5 | 120 | 20 | Excellent | Excellent | Excellent | Excellent | Excellent | Excellent |
| Sample 22 | PI | c | 7.9 | 21.3 | 0.5 | 120 | 20 | Excellent | Excellent | Excellent | Excellent | Excellent | Excellent |
| Sample 23 | m-PPE | c | 7.9 | 21.3 | 0.5 | 120 | 20 | Excellent | Excellent | Excellent | Excellent | Excellent | Excellent |
| Sample 24 | PET | c | 7.9 | 21.3 | 0.5 | 120 | 20 | Excellent | Excellent | Excellent | Excellent | Excellent | Excellent |
| Sample 25 | PET | c | 7.9 | 21.3 | 0.5 | 120 | 20 | Excellent | Excellent | Excellent | Excellent | Excellent | Excellent |
| Sample 26 | PP | c | 7.9 | 21.3 | 5 | 120 | 20 | Excellent | Excellent | Excellent | — | — | Excellent |
| Sample 27 | PA | c | 7.9 | 21.3 | 5 | 120 | 20 | Excellent | Excellent | Excellent | — | — | Excellent |
| Sample 28 | ABS | c | 7.9 | 21.3 | 5 | 120 | 20 | Excellent | Excellent | Excellent | — | — | Excellent |
| Sample 29 | PE | c | 7.9 | 21.3 | 5 | 120 | 20 | Excellent | Excellent | Excellent | — | — | Excellent |
| Sample 30 | PC | c | 7.9 | 21.3 | 5 | 120 | 20 | Excellent | Excellent | Excellent | — | — | Excellent |
| Sample 31 | POM | c | 7.9 | 21.3 | 5 | 120 | 20 | Excellent | Excellent | Excellent | — | — | Excellent |
| Sample 32 | PBT | c | 7.9 | 21.3 | 5 | 120 | 20 | Excellent | Excellent | Excellent | — | — | Excellent |
| Sample 33 | m-PPE | c | 7.9 | 21.3 | 5 | 120 | 20 | Excellent | Excellent | Excellent | — | — | Excellent |
| Sample 34 | PPS | c | 7.9 | 21.3 | 5 | 120 | 20 | Excellent | Excellent | Excellent | — | — | Excellent |

The abbreviations in Table 2 represent the following compounds.

PET: polyethylene terephthalate resin
PEN: polyethylene naphtholate resin
PI: polyimide resin
PP: polypropylene resin
PA: polyamide resin
ABS: acrylonitrile butadiene styrene resin
PE: polyethylene resin
PC: polycarbonate resin
POM: polyacetal resin
PBT: polybutylene terephthalate resin
m-PPE: modified polyphenylene ether resin
PPS: polyphenylene sulfide resin

[Samples 35 to 40]

Samples 35 to 40 were obtained by forming a coating layer having a thickness of 0.8 μm on a support PI film in the same manner as Sample 1 using dispersions (a), (c), and (d) described above, dispersion (j) (2.8 g precipitate, 0 g copper powder, 2.0 g organic matter BYK145, and 6.6 g ethanol solvent), dispersion (k) (2.8 g precipitate, 0 g copper powder, 2.0 g organic matter BYK145, 6.6 g ethanol solvent, and 0.01 g hydrazine hydrate), which is obtained by adding hydrazine hydrate to dispersion (c), and dispersion (l) (2.8 g precipitate, 0 g copper powder, 2.0 g organic matter BYK145, 6.6 g ethanol solvent, and 0.1 g hydrazine hydrate), which is obtained by adding hydrazine hydrate to dispersion (c), respectively. It should be known that the ratio of hydrazine mass/copper oxide mass in dispersions (k) and (l) were 0.003 and 0.03, respectively.

The smoothnesses of the coating layer surfaces of the samples were measured. The smoothnesses were measured by measuring the arithmetic average height at a length of 1000 μm using a stylus-type film thickness measurement device (DektakXT manufactured by ULVAC, Inc.). The evaluation criteria are described below.

Excellent: Ra is less than 30 nm
Good: Ra is in the range of 30 nm to less than 100 nm
Poor Ra is 100 nm or less A conductive pattern region including copper having desired dimensions of 25 mm×1 mm was obtained by irradiating the substrate of a sample with laser light (wavelength 532 nm; output 0.45 W; continuous wave (CW)) in an argon gas atmosphere while moving the focal point at a maximum speed of 100 mm/sec using a Galvano scanner.

The film thicknesses of the conductive pattern regions of the samples were measured. The thickness were measured by peeling away a part of the conductive pattern region to expose the support, and measuring the level difference of the conductive pattern region remaining from the support using a stylus-type film thickness measuring device (DektakXT manufactured by ULVAC, Inc.). Further, the ratio of the insulation region, which is unsintered, was further calculated.

The surface roughnesses of the conductive pattern regions of the samples were measured. The surface roughnesses were measured by measuring the arithmetic average height Ra across a length of 1000 μm using a stylus-type film thickness measuring device (DektakXT manufactured by ULVAC, Inc.). The evaluation criteria are described as follows.

Excellent: Ra is in the range of 50 nm to less than 200 nm
Good: Ra is in the range of 20 nm to less than 50 nm, or 200 nm to less than 500 nm
Poor: Ra is less than 20 nm or 500 nm or more The resistance values of the ends of the conductive pattern region were evaluated using the four-terminal measurement method. The evaluation criteria are described as follows.

Excellent: the resistance value is less than 30 μΩcm
Good: the resistance value is in the range of 30 μΩcm to less than 100 μΩcm
Poor: the resistance value is 100 gΩcm or more (Measurement of Withstand Voltage)

Two conductive pattern regions having the dimensions of 25 mm×1 mm described above were arranged at an interval of 1 mm, and the withstand voltage of an insulation region, which is an unsintered portion located therebetween, including cuprous oxide, phosphorus-containing organic matter, and hydrazine or hydrazine hydrate was measured.

The withstand voltage was measured by connecting two needle-like probes to the conductive pattern region, applying AC voltage between the two needle-like probes using a withstand voltage tester TOS5300 manufactured by Kikusui Electronics Corp., and gradually increasing the voltage to measure the voltage value which causes insulation breakdown. The evaluation criteria are described as follows.

Excellent: the withstand voltage is 1.7 kV/mm or more
Good: the withstand voltage is in the range of 1 kV/mm to less than 1.7 kV/mm
Poor: the withstand voltage is less than 1 kV/mm (Evaluation Results)

[Samples 1 to 25]

All of dispersions (a) to (i) had suitable dispersibilities without the occurrence of aggregate precipitation in visual evaluation.

Regarding Sample 1, in laser sintering, though partial peeling of the conductive pattern region could be observed, as a whole, the conductive pattern region adhered to the support, and confirmation of the conductivity could be performed. In xenon-flash sintering, the applied dispersion was blown away during sintering, whereby a conductive pattern region could not be obtained.

Regarding Samples 2 to 4, 7, and 9 to 17, in laser sintering, the conductive pattern regions adhered to the supports, and confirmation of the conductivities thereof could be performed. In xenon-flash sintering, the applied dispersions were blown away during sintering, whereby conductive pattern regions could not be obtained.

Regarding Samples 5 and 6, the content of phosphorus-containing organic matter in the layer was high, whereby the conductivity evaluation results thereof were good. The layer arranged on the support adhered to the support after sintering of the cuprous oxide.

Regarding Sample 8, in both laser sintering and xenon-flash sintering, a conductive pattern region which adhered to the support and which had excellent conductivity could be obtained.

Regarding Samples 18 and 19, though conductive pattern regions could be obtained by laser sintering, the adhesiveness was such that partial peeling from the support occurred during laser sintering.

Samples 20 to 25 included adhesion layers, and thus, during both laser sintering and xenon-flash sintering, conductive pattern regions which adhered to the support could be obtained.

[Samples 26 to 34]

Housings lacking an adhesion layer and composed of a material different from those shown in Table 2 were prepared as supports. The housings had a curved body having a bowl-like shape with a radius of curvature of 500 mm. Samples 26 to 34 were obtained by applying dispersion (c) to the prepared housings by spray-coating so as to achieve a dry film thickness of 5 μm. Thereafter, conductive pattern regions including copper having a desired dimension of 25 mm×1 mm on the surface of the housings were obtained by irradiating Samples 26 to 34 with laser light (wavelength 445 nm; output 1.5 W; continuous wave (CW)) in an argon gas atmosphere while moving the focus position at a maximum speed of 300 mm/min so that it is in focus on the bowl-shaped surfaces of the housings using a Galvano scanner. The obtained conductive pattern regions had fine cracks in portions thereof, but adhered with the housings and had excellent conductivities.

[Samples 35 to 40]

Dispersions (j), (k), and (l) were suitable in dispersibility without the occurrence of aggregate precipitation in visual inspection.

The smoothnesses of the coating layers of Samples 35 to 40 were evaluated. The evaluation results are shown in Table 3. By being smooth, light can be suitably absorbed without irregular reflection on the surface of the coating layer when irradiation with light rays is performed.

The resistance values of the conductive pattern regions of Samples 35 to 40 were evaluated. The evaluation results are shown in Table 3. When the Sample 38 was irradiated with laser light, the coating layer was ablated, whereby a suitable conductive pattern region could not be obtained.

The film thicknesses of the conductive pattern regions of Samples 35 to 37, 39, and 40 were measured, and the film thickness ratios thereof with the insulation region, which is unsintered, were calculated. The calculation results are shown in Table 3. The film thickness ratios were in the range of 45 to 50%.

The surface roughness of the conductive pattern regions of Samples 35 to 37, 39, and 40 were evaluated. The evaluation results are shown in Table 3. All of the samples had suitable surface roughnesses.

Withstand voltage evaluation of the insulation regions of Samples 35 to 37, 39, and 40 were performed. The evaluation results are shown in Table 3. Samples 36, 37, 39, and 40 had suitable withstand voltages.

A resin layer (PET film: Cosmoshine A4100 manufactured by Toyobo Co., Ltd.; thickness 100 μm) serving as a sealing layer was arranged on Sample 36. A layer including silicon oxide as a moisture barrier layer, and an adhesive layer (MO-series optical adhesive sheet manufactured by Lintec Co., Ltd.) for adhesion with the layer comprising a conductive pattern region arranged on the support were provided on the resin layer. Furthermore, the resin layer was sealed with a thermosetting encapsulant (AES-210 manufactured by Ajinomoto Fine Technologies Co., Ltd.) in order to prevent the penetration of moisture from the edges of the resin layer. Further, a part of the resin layer was opened to expose the conductive pattern region, and an electrode was provided therein using low-temperature solder (eco solder LEO manufactured by Senju Metal Industry Co., Ltd.). In this state, an accelerated evaluation for conductive deterioration of the conductive pattern region was performed in an environment of 85° C. and 85 RH %. As a result of evaluation of the resistance value after 1000 hours, the resistance change rate was +5% or less, which was suitable. This is considered to be a result of the inhibition of change in the resistance of the conductive pattern region due to oxidization of the phosphorus prior to oxidation of the copper by oxygen and moisture included in small quantities in the sealed interior during the accelerated evaluation.

Figure 12A:
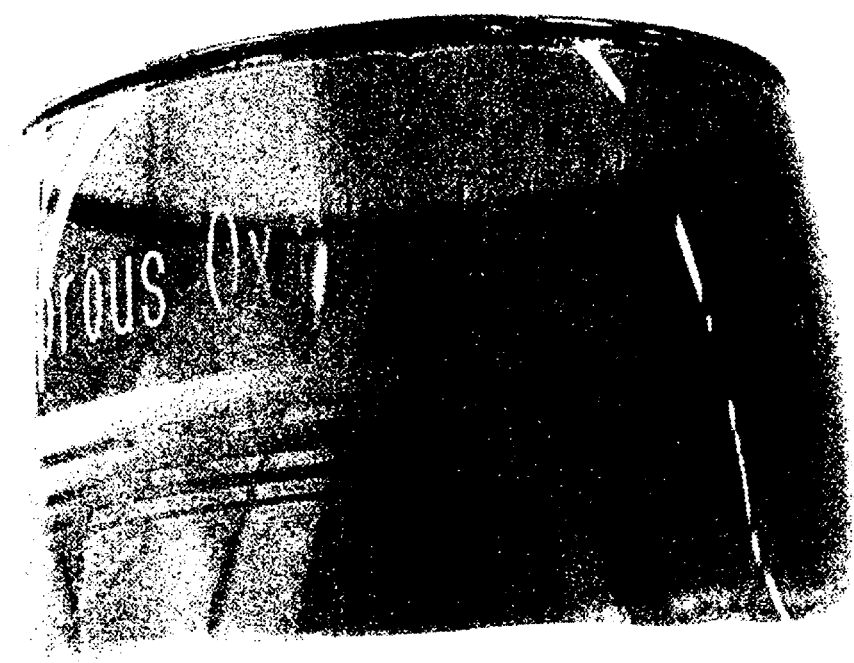
FIG. 12A is a photograph of a conductive pattern region formed on a glass surface.
Figure 12B:
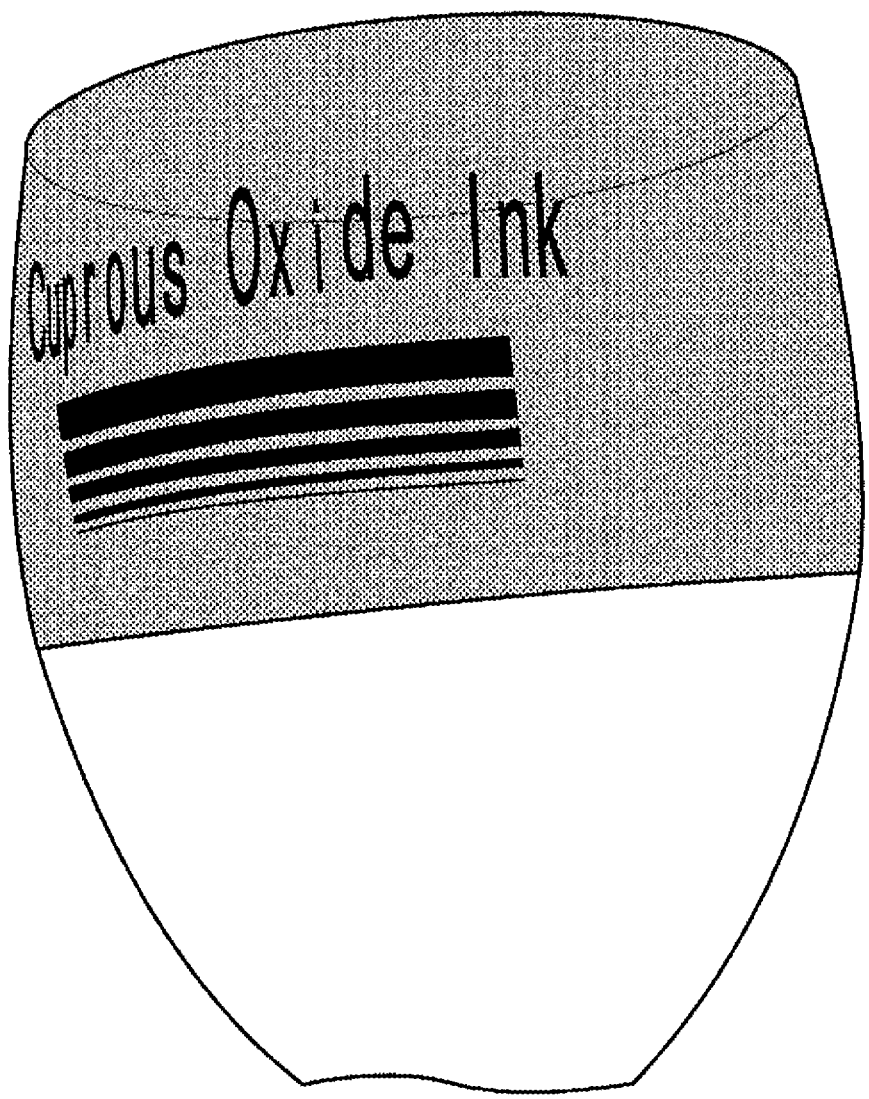
FIG. 12B is a schematic view of FIG. 12A.

A glass wineglass as a support having a three-dimensional curved surface was prepared as Sample 41. The radius of curvature of the wineglass was 35 mm. A coating layer having a dry film thickness of 2 μm was obtained on the exterior surface of the wineglass by immersing the wineglass in a container filled with dispersion (c) and withdrawing at a constant rate. Thereafter, the coating layer was irradiated with laser light (wavelength 532 nm; output 0.22 W; pulse repetition frequency 260 kHz) using a laser marker (laser marker MD-S9910A manufactured by Keyence Corporation) in air at a rate of 20 mm/sec. As a result, a conductive pattern region including reduced copper was obtained on the surface of the wineglass. A photograph thereof is shown in FIG. 12A. FIG. 12B is a schematic view of the same. The obtained conductive pattern region adhered to the glass, the resistance value evaluation of the conductive pattern region was excellent, and the withstand voltage evaluation of the insulation pattern region was excellent.

Figure 12C:
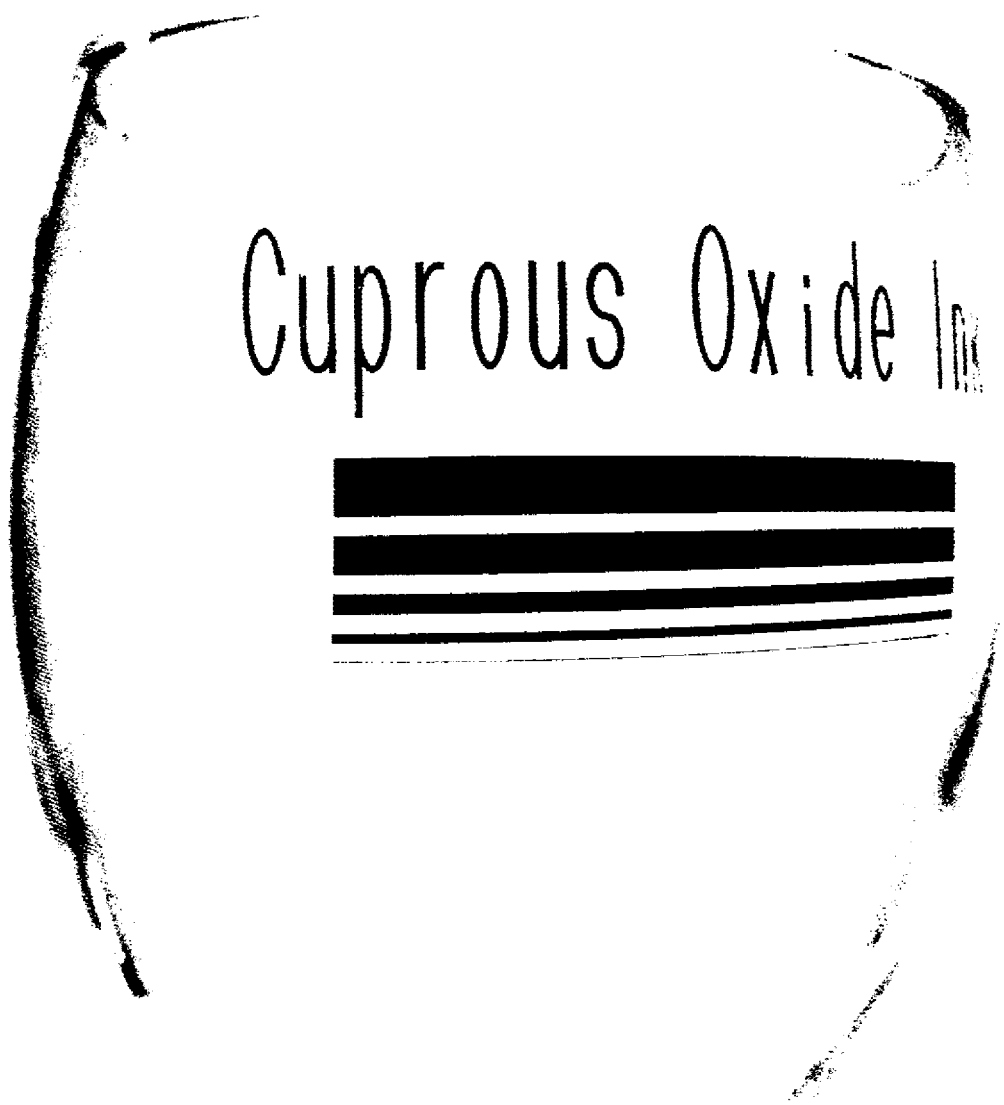
FIG. 12C is a photograph after the insulation region has been removed from FIG. 12A.

Further, in order to obtain copper wiring, the insulation regions, which are the portions which were not subjected to laser light irradiation, in the coating layer were removed using ethanol, which is a cleaning solvent. A photograph after removal is shown in FIG. 12C. The resistance value evaluation of the copper wiring after removal was excellent, which was suitable.

In the same manner as the experiment described above, a glass wineglass as a support having a three-dimensional curved surface was prepared as Sample 42. The radius of curvature of the wineglass was 35 mm. A coating layer having a dry film thickness of 2 μm was obtained on the exterior surface of the wineglass by immersing the wineglass in a container filled with dispersion (c) and withdrawing at a constant rate. Thereafter, the coating layer was irradiated with laser light (wavelength 355 nm; output 0.25 W; pulse repetition frequency 300 kHz) using a laser marker different from that in the above experiment (laser marker MD-U1000C manufactured by Keyence Corporation) in air at a rate of 20 mm/sec. As a result, a conductive pattern region including reduced copper was obtained on the surface of the wineglass. The obtained conductive pattern region adhered to the glass, and exhibited conductivity.

As Sample 43, a slightly adhesive PET film (SRL-0753 manufactured by Lintec Corporation) as a resin layer having an oxygen barrier property was attached to the surface of the coating layer of Sample 36, and the coating layer was irradiated with laser light (wavelength 532 nm; output 0.22 W; pulse repetition frequency 260 kHz), passing through the resin layer, using a laser marker (laser marker MD-S9910A manufactured by Keyence Corporation) in air at a rate of 20 mm/sec. Thereafter, the resin layer was removed. The obtained conductive pattern region adhered with the PI film, the resistance value evaluation of the conductive pattern region was excellent, and the withstand voltage evaluation of the insulation region was excellent.

Further, a resin layer (PET film: Cosmoshine A4100 manufactured by Toyobo Co., Ltd., thickness 100 μm) as a sealing material layer, which is an example of another resin layer, was arranged on the conductive pattern region, which was exposed by the removal of the resin layer, and the insulation region. A layer including silicon oxide was provided on the resin layer as a moisture barrier layer, and in order to promote adhesion with the layer including a conductive pattern region arranged on the support, an adhesive layer (MO-series optical adhesive sheet manufactured by Lintec Co., Ltd.) was provided. Furthermore, the sample was sealed with a thermosetting sealing material (AES-210 manufactured by Ajinomoto Fine Techno Co., Ltd.) in order to prevent the penetration of moisture from the edges of the resin layer. Further, a part of the resin layer was opened to expose the conductive pattern region, and an electrode was provided therein using low-temperature solder (eco solder LEO manufactured by Senju Metal Industry Co., Ltd.). In this state, an accelerated evaluation for conductive deterioration of the conductive pattern region was performed in an environment of 85° C. and 85 RH %. As a result of evaluation of the resistance value after 1000 hours, the resistance change rate was +5% or less, which was suitable. This is considered to be a result of the inhibition of change in the resistance of the conductive pattern region due to oxidization of the phosphorus prior to oxidation of the copper by oxygen and moisture included in small quantities in the sealed interior during the accelerated evaluation.

Comparative Example 1

A dispersion (x) including cuprous oxide fine particles was obtained in the same manner as dispersion (a) except that polyvinyl pyrrolidone (hereinafter referred to as PVP) was used in place of the phosphorus-containing organic matter. It should be noted that dispersion (x) was composed of 2.8 g of precipitate, 0.2 g of polyvinyl pyrrolidone, and 6.6 g of ethanol dispersion medium, and the content of copper oxide in the cuprous oxide fine particles was 100% by volume.

A coating layer of dispersion (x) having a thickness of 0.5 μm was formed on a PET film (Cosmoshine A4100 manufactured by Toyobo Co., Ltd.) having a thickness of 100 μm as a support in the same manner as Samples 1 to 19, whereby Comparative Example 1 was obtained.

A conductive pattern region including copper having desired dimensions of 25 mm×1 mm was obtained by irradiating the substrate of the sample of Comparative Example 1 with laser light (wavelength 445 nm; output 1.2 W, continuous wave (CW)) while moving the focal point at a maximum rate of 300 mm/min using a Galvano scanner.

Two needle-like probes were attached to the insulation region, which is the unsintered portion of Comparative Example 1 after sintering, at an interval of 5 mm. Using an insulation resistance tester TOS7200 manufactured by Kikusui Electronics Co., Ltd., a voltage of DC 500V was applied between the two needle-like probes for 1 minute, and as a result of evaluation of the resistance value at that time, the resistance value was less than 1 MΩ, and the insulation property thereof was insufficient.

Further, in the same manner as described above, the withstand voltage of the insulation region, which is the unsintered portion, which includes cuprous oxide but which does not include phosphorus-containing organic matter nor hydrazine or hydrazine hydrate, was measured. As a result, the withstand voltage was 0.9 kV/mm, which was a poor evaluation.

Comparative Example 2

A coating layer having a thickness of 1.0 μm was formed on a support PI film (Kapton 500H manufactured by Toray DuPont; thickness 125 μm) was formed in the same manner as Samples 1 to 19 using Metalon ICI-021 manufactured by Novacentrix Corporation as the dispersion including cupric oxide particles in place of the dispersion including cuprous oxide particles, phosphorus-containing organic matter, and hydrazine or hydrazine hydrate, whereby Comparative Example 2 was obtained.

A conductive pattern region was obtained by laser light irradiation in the same manner as Samples 35 to 38.

Like Samples 35 to 38, the results of the performance of evaluation of each item are shown in Table 3. The smoothness of the coating layer was poor. It is believed that in the step in which the coating layer was formed, the wettability between the dispersion and the support was poor, and since hydrazine or hydrazine hydrate and phosphorus-containing organic matter were not included, the dispersibility of copper oxide particles in the coating layer state was poor, and agglomeration occurred.

The resistance value of the conductive pattern region was poor. It is believed that since the smoothness of the coating layer was poor, and hydrazine or hydrazine hydrate and phosphorus-containing organic matter were not included, the copper oxide particles could not be suitably reduced and sintered with laser light.

The film thickness of the conductive pattern region was measured, and the film thickness ratio thereof with the insulation region, which is the unsintered portion, was calculated. The film thickness ratio was 68%.

The surface roughness of the conductive pattern region was poor. In Comparative Example 2, it is believed that since the smoothness of the coating layer was poor, and hydrazine or hydrazine hydrate and phosphorus-containing organic matter were not included, the copper oxide particles could not be suitably reduced and sintered with laser light, whereby the surface thereof becomes rough due to a lack of bonding between particles. Note that even if at least one of hydrazine or hydrazine hydrate and phosphorus-containing organic matter were included, it is believed that reduction and sintering of the copper oxide particles by laser light could not be performed.

The withstand voltage evaluation of the insulation region was good. In Comparative Example 2, it is believed that since hydrazine or hydrazine hydrate and phosphorus-containing organic matter were not included, the dispersibility of the copper oxide particles in the coating layer was poor, and the insulation property could not be fully developed. Note that even if at least one of the hydrazine or hydrazine hydrate and phosphorus-containing organic matter were included, it is believed that the dispersibility of the copper oxide particles in the coating layer would be poor.

Comparative Example 3

Using dispersion (c), a coating layer (thickness 0.8 μm) was formed on a borosilicate glass substrate support (Tempax manufactured by Schott AG) by the reverse transfer method, in which two 25 mm×1 mm patterns were arranged in parallel at an interval of 1 mm. Further, the coating layer was reduced by a plasma sintering method to obtain two conductive pattern regions including reduced copper and phosphorus having dimensions of 25 mm×1 mm.

The withstand voltages of the two obtained conductive pattern regions were poor. It is believed that the insulation property cannot be exhibited as a result of a state in which an insulation region is not included between the two conductive pattern regions, and only air is present therebetween.

[Measurement of Phosphorus in Conductive Pattern Region]

The measurement of elemental phosphorus in the conductive pattern region of Sample 8 formed after laser sintering described above was performed.

1) Sample Preparation, XPS Measurement

A small 3 mm square piece was cut out from Sample 8 after laser sintering, and a 5 mmφ mask was arranged thereon to perform XPS measurement. Depth direction analysis of the XPS measurement was performed by $Ar^+$ ion sputtering.

<XPS Measurement Conditions>

Measurement Device: Versa Probe II manufactured by ULVAC-PHI, Inc.

Excitation Source: mono. AlKα 15 kV×3.3 mA

Analysis Size: approximately 200 μmφ

Photoelectron extraction angle: 45°±20°

Acquisition Region: Cu 2p3/2, P 2p, C 1s, O 1s, N 1s

Pass Energy: 93.9 eV

<$Ar^+$ Ion Sputtering Conditions

Acceleration Voltage: 3 kV

Sample Current: 1.6 μA

Raster Size: 2 mm×2 mm

Sample Rotation: Yes

As a result of XPS measurement, it was confirmed that the content of elemental phosphorus of Sample 8 with respect to copper was 0.127 atom/atom % in terms of atomic composition and 0.062 w/w % in terms of mass.

For Samples 35 to 37, measurement of the elemental phosphorus in the formed conductive pattern region was performed after the laser sintering described above was performed. The evaluation results are shown in Table 3. All of the samples demonstrated a phosphorus/copper elemental concentration ratio in the range of 0.02 to 0.30. Likewise, measurement of elemental carbon and measurement of elemental nitrogen in the conductive pattern region were performed. The evaluation results are shown in Table 3. All of the samples demonstrated a carbon/copper elemental concentration ratio in the range of 1 to 6. Furthermore, all of the samples demonstrate a nitrogen/copper elemental concentration ratio in the range of 0.04 to 0.6.

Table 3 is shown below.

TABLE 3

|  | Dispersion | Phosphorus/Copper Elemental Concentration Ratio | Carbon/Copper Elemental Concentration Ratio | Nitrogen/Copper Elemental Concentration Ratio | Ink Dispersibility | Dry Film Smoothness | Conductive Pattern Region Resistance Value | Film Thickness Ratio with Insulation Region | Conductive Pattern Region Surface Roughness | Conductivity |
|---|---|---|---|---|---|---|---|---|---|---|
| Sample 35 | a | 0.05 | 1.58 | 0.08 | Excellent | Excellent | Good | 48% | Excellent | Good |
| Sample 36 | c | 0.24 | 4.87 | 0.47 | Excellent | Excellent | Excellent | 45% | Excellent | Excellent |
| Sample 37 | d | 0.19 | 4.11 | 0.41 | Excellent | Excellent | Excellent | 46% | Excellent | Excellent |

TABLE 3-continued

| | Dispersion | Phosphorus/ Copper Elemental Concentration Ratio | Carbon/ Copper Elemental Concentration Ratio | Nitrogen/ Copper Elemental Concentration Ratio | Ink Dispersibility | Dry Film Smoothness | Conductive Pattern Region Resistance Value | Film Thickness Ratio with Insulation Region | Conductive Pattern Region Surface Roughness | Conductivity |
|---|---|---|---|---|---|---|---|---|---|---|
| Sample 38 | j | — | — | — | Excellent | Excellent | — | — | — | — |
| Sample 39 | k | — | — | — | Excellent | Excellent | Excellent | 46% | Excellent | Excellent |
| Sample 40 | l | — | — | — | Excellent | Excellent | Excellent | 46% | Excellent | Excellent |
| Comp. Ex. 2 | ICI-021 | — | — | — | — | Poor | Poor | 68% | Poor | Good |

It should be noted that the present invention is not limited to the embodiments and Examples described above. Design changes or the like may be added to the above embodiments and Examples based on the knowledge of a person skilled in the art, and the embodiments and Examples may be arbitrarily combined. Aspects in which such changes or the like have been made are also encompassed by the scope of the present invention.

The present invention can provide a structure including a conductive pattern region in which the electrical insulation within the conductive pattern region is excellent, and which has excellent long-term reliability.

Furthermore, the present invention can provide a stack and a method for the production thereof with which equipment for generating a vacuum atmosphere or inert gas atmosphere are not necessary in a copper oxide light sintering treatment, and with which the production costs of the structure can be reduced.

As described above, the structure and stack according to the present invention can be suitably used for wiring materials such as electronic circuit boards, mesh electrodes, electromagnetic wave shielding materials, and heat dissipation materials.

The present application is based on Japanese Patent Application 2017-139133 and Japanese Patent Application 2017-139134, which have filing dates of Jul. 18, 2017, Japanese Patent Application 2017-141518 and Japanese Patent Application 2017-141519, which have filing dates of Jul. 21, 2017, Japanese Patent Application 2017-145188, which has a filing date of Jul. 27, 2017, and Japanese Patent Application 2018-023239, which has a filing date of Feb. 13, 2018. The contents thereof are incorporated herein in full.

The invention claimed is:

1. A structure comprising a support and a layer arranged on a surface constituted by the support, wherein an insulation region including copper oxide and phosphorus is arranged between conductive pattern regions including copper in the layer.

2. The structure according to claim 1, wherein the insulation region further includes hydrazine or hydrazine hydrate.

3. The structure according to claim 2, wherein in the insulation region, the copper oxide is fine particles including the copper oxide, the phosphorus is phosphorus-containing organic matter, and the content of the phosphorus-containing organic matter is 5 parts by volume to 900 parts by volume when the total volume of the fine particles is 100 parts by volume.

4. The structure according to claim 2, wherein the layer has layer having an oxygen barrier property arranged thereon.

5. The structure according to claim 2, wherein the layer is arranged on the support, which has a steric surface.

6. The structure according to claim 2, wherein the copper included in the conductive pattern regions is reduced copper obtained by reducing the copper oxide.

7. The structure according to claim 1, wherein the conductive pattern regions further include phosphorus.

8. The structure according to claim 7, wherein in the insulation region, the copper oxide is fine particles including the copper oxide, the phosphorus is phosphorus-containing organic matter, and the content of the phosphorus-containing organic matter is 5 parts by volume to 900 parts by volume when the total volume of the fine particles is 100 parts by volume.

9. The structure according to claim 7, wherein the layer has layer having an oxygen barrier property arranged thereon.

10. The structure according to claim 7, wherein the layer is arranged on the support, which has a steric surface.

11. The structure according to claim 7, wherein the copper included in the conductive pattern regions is reduced copper obtained by reducing the copper oxide.

12. The structure according to claim 1, wherein in the insulation region, the copper oxide is fine particles including the copper oxide, the phosphorus is phosphorus-containing organic matter, and the content of the phosphorus-containing organic matter is 5 parts by volume to 900 parts by volume when the total volume of the fine particles is 100 parts by volume.

13. The structure according to claim 1, wherein the layer has a resin layer having an oxygen barrier property arranged thereon.

14. The structure according to claim 1, wherein the layer is arranged on the support, which has a steric surface.

15. The structure according to claim 1, wherein the copper included in the conductive pattern regions is reduced copper obtained by reducing the copper oxide.

16. The structure according to claim 1, wherein a film thickness of the conductive pattern regions is in a range of 10% to 90% relative to a film thickness of the insulation region.

17. A structure comprising a support and a layer arranged on a surface constituted by the support, wherein an insulation region including copper oxide, and hydrazine or hydrazine hydrate is arranged between conductive pattern regions including copper in the layer.

18. The structure according to claim 17 wherein the layer has layer having an oxygen barrier property arranged thereon.

19. The structure according to claim 17, wherein the layer is arranged on the support, which has a steric surface.

20. The structure according to claim 17, wherein the copper included in the conductive pattern regions is reduced copper obtained by reducing the copper oxide.

21. The structure according to claim 17, wherein a film thickness of the conductive pattern regions is in a range of 10% to 90% relative to a film thickness of the insulation region.

22. A stack comprising a support, a coating layer, which is arranged on a surface constituted by the support and which includes copper oxide and phosphorus, and an oxygen barrier layer arranged so as to cover the coating layer,
  wherein either the oxygen barrier layer or the support is light transmissive.

23. The stack according to claim 22, wherein the coating layer further includes hydrazine or hydrazine hydrate.

24. The stack according to claim 23, wherein the copper oxide is fine particles including the copper oxide, the phosphorus is phosphorus-containing organic matter, and the content of the phosphorus-containing organic matter is 5 parts by volume to 900 parts by volume when the total volume of the fine particles is 100 parts by volume.

25. The stack according to claim 23, wherein the coating layer is arranged on the support, which has a steric surface.

26. The stack according to claim 22, wherein the copper oxide is fine particles including the copper oxide, the phosphorus is phosphorus-containing organic matter, and the content of the phosphorus-containing organic matter is 5 parts by volume to 900 parts by volume when the total volume of the fine particles is 100 parts by volume.

27. The stack according to claim 22, wherein the coating layer is arranged on the support, which has a steric surface.

28. A stack comprising a support, a coating layer, which is arranged on a surface constituted by the support and which includes copper oxide, and hydrazine or hydrazine hydrate, and an oxygen barrier layer arranged so as to cover the coating layer,
  wherein either the oxygen barrier layer or the support is light transmissive.

29. The stack according to claim 28, wherein the coating layer is arranged on the support, which has a steric surface.

30. Copper wiring comprising reduced copper, which is obtained by reducing copper oxide, phosphorus, and carbon, wherein the elemental concentration ratio of phosphorus to copper is 0.02 to 0.30, and the elemental concentration ratio of carbon to copper is 1.0 to 6.0.

31. The copper wiring according to claim 30, wherein the arithmetic average roughness Ra of the surface of the copper wiring is 20 nm to 500 nm.

32. A method for the production of a structure, comprising the steps of:
  arranging a coating layer comprising copper oxide and phosphorus-containing organic matter on a surface constituted by a support, and
  selectively irradiating the coating layer with light to reduce the copper oxide to copper, to obtain the support and a layer in which an insulation region including the copper oxide and phosphorus is arranged between conductive pattern regions including the copper on the surface constituted by the support.

33. The method for the production of a structure according to claim 32, further comprising the step of arranging a first resin layer so as to cover the coating layer.

34. A method for the production of a structure, comprising the steps of:
  arranging a coating layer comprising copper oxide, and hydrazine or hydrazine hydrate on a surface constituted by a support, and
  selectively irradiating the coating layer with light to reduce the copper oxide to copper, to obtain the support and a layer in which an insulation region including the copper oxide, and the hydrazine or hydrazine hydrate is arranged between conductive pattern regions including the copper on the surface constituted by the support.

35. The method for the production of a structure according to claim 34, further comprising the step of arranging a first resin layer so as to cover the coating layer.

36. A method for the production of a structure, comprising the steps of:
  arranging a coating layer comprising copper oxide and phosphorus-containing organic matter on a surface constituted by a support,
  selectively irradiating the coating layer with light to reduce the copper oxide to copper, to obtain the support and a layer in which an insulation region including the copper oxide and phosphorus and a conductive pattern region including the copper are arranged adjacent to each other on the surface constituted by the support, and
  removing the insulation region from the layer.

37. The method for the production of a structure according to claim 36, further comprising the step of arranging a second resin layer so as to cover at least the conductive pattern region.

38. A method for the production of a stack, comprising the steps of:
  arranging a coating layer including copper oxide and phosphorus-containing organic matter on a surface constituted by a support, and
  arranging an oxygen barrier layer so as to cover the coating layer,
wherein either the oxygen barrier layer or the support is light transmissive.

39. A method for the production of a stack, comprising the steps of:
  arranging a coating layer including copper oxide, and hydrazine or hydrazine hydrate on a surface constituted by a support, and
  arranging an oxygen barrier layer so as to cover the coating layer,
wherein either the oxygen barrier layer or the support is light transmissive.

40. A method for the production of a stack, comprising the steps of:
  arranging a coating layer including copper oxide, phosphorus-containing organic matter, and hydrazine or hydrazine hydrate on a surface constituted by a support, and
  arranging an oxygen barrier layer so as to cover the coating layer,
wherein either the oxygen barrier layer or the support is light transmissive.

41. A method for the production of a structure, comprising the steps of:
  arranging a coating layer comprising copper oxide, and hydrazine or hydrazine hydrate on a surface constituted by a support,
  selectively irradiating the coating layer with light to reduce the copper oxide to copper, to obtain the support and a layer in which an insulation region including the copper oxide, and the hydrazine or hydrazine hydrate and a conductive pattern region including the copper are arranged adjacent to each other on the surface constituted by the support, and
  removing the insulation region from the layer.

* * * * *